US011769863B2

(12) United States Patent
Yamada et al.

(10) Patent No.: US 11,769,863 B2
(45) Date of Patent: Sep. 26, 2023

(54) LIGHT EMITTING DEVICE, METHOD OF MANUFACTURING LIGHT EMITTING DEVICE, PLANAR LIGHT SOURCE, AND LIQUID CRYSTAL DISPLAY DEVICE

(71) Applicant: NICHIA CORPORATION, Anan (JP)

(72) Inventors: Yuichi Yamada, Itano-gun (JP); Takeshi Tamura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/981,701

(22) Filed: Nov. 7, 2022

(65) Prior Publication Data

US 2023/0056016 A1 Feb. 23, 2023

Related U.S. Application Data

(62) Division of application No. 17/459,132, filed on Aug. 27, 2021, now Pat. No. 11,527,686.

(30) Foreign Application Priority Data

Aug. 31, 2020 (JP) ................................ 2020-146209

(51) Int. Cl.
H01L 33/50 (2010.01)
H01L 25/075 (2006.01)
G02F 1/13357 (2006.01)
H01L 33/60 (2010.01)

(52) U.S. Cl.
CPC ...... H01L 33/505 (2013.01); G02F 1/133603 (2013.01); H01L 25/0753 (2013.01); H01L 33/60 (2013.01); H01L 2933/0041 (2013.01); H01L 2933/0058 (2013.01)

(58) Field of Classification Search
CPC ................. H01L 2933/005; H01L 2933/0041
See application file for complete search history.

(56) References Cited

U.S. PATENT DOCUMENTS

| 9,039,216 | B2 | 5/2015 | Kim |
| 9,070,845 | B2 | 6/2015 | Kim et al. |
| 9,196,801 | B2 | 11/2015 | Kanemaru |
| 2002/0028527 | A1 | 3/2002 | Maeda et al. |
| 2007/0194712 | A1 | 8/2007 | Shiraishi et al. |
| 2009/0224653 | A1 | 9/2009 | Wang et al. |
| 2011/0211334 | A1 | 9/2011 | Kim |

(Continued)

FOREIGN PATENT DOCUMENTS

| JP | 2008-060166 A | 3/2008 |
| JP | 2013-118210 A | 6/2013 |

(Continued)

OTHER PUBLICATIONS

Non-Final Office Action on U.S. Appl. No. 17/459,132 dated Jun. 23, 2022.

(Continued)

Primary Examiner — Andrew J Coughlin
(74) Attorney, Agent, or Firm — Foley & Lardner LLP

(57) ABSTRACT

A light emitting device includes: a base; a phosphor frame positioned inward of edges of a lower face of the base; a light emitting element disposed in an area surrounded by the phosphor frame; and a light transmissive member contacting at least a portion of the edges of the lower face of the base and at least a portion of outer lateral faces of the phosphor frame.

7 Claims, 45 Drawing Sheets

(56) References Cited

U.S. PATENT DOCUMENTS

| | | | |
|---|---|---|---|
| 2012/0153335 A1 | 6/2012 | Matsushita et al. | |
| 2013/0320380 A1 | 12/2013 | Kanemaru | |
| 2014/0138725 A1 | 5/2014 | Oyamada | |
| 2015/0311405 A1 | 10/2015 | Oyamada et al. | |
| 2018/0151785 A1 | 5/2018 | Hashimoto | |
| 2018/0212128 A1 | 7/2018 | Hayashi | |
| 2018/0287020 A1 | 10/2018 | Kim et al. | |
| 2019/0081219 A1 | 3/2019 | Chen | |
| 2020/0209458 A1* | 7/2020 | Yuu | H01L 33/62 |
| 2020/0335673 A1 | 10/2020 | Kim et al. | |
| 2021/0119087 A1* | 4/2021 | Kim | H01L 33/56 |

FOREIGN PATENT DOCUMENTS

| | | | |
|---|---|---|---|
| JP | 2013-251393 A | 12/2013 |
| JP | 2016-119454 A | 6/2016 |
| JP | 2017-112146 A | 6/2017 |
| JP | 2017-163105 A | 9/2017 |

OTHER PUBLICATIONS

Notice of Allowance on U.S. Appl. No. 17/459,132 dated Oct. 6, 2022.

* cited by examiner

Fig. 14
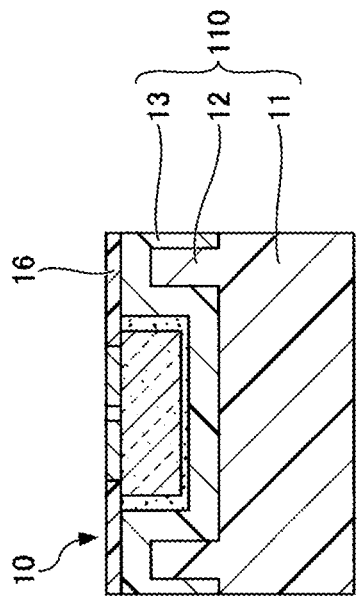
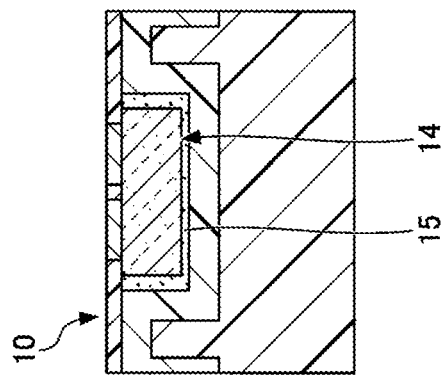
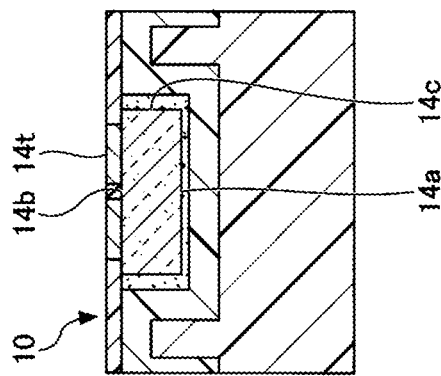

LIGHT EMITTING DEVICE, METHOD OF MANUFACTURING LIGHT EMITTING DEVICE, PLANAR LIGHT SOURCE, AND LIQUID CRYSTAL DISPLAY DEVICE

CROSS-REFERENCE TO RELATED APPLICATION

This application is a division of U.S. patent application Ser. No. 17/459,132, filed on Aug. 27, 2021, which claims priority to Japanese Patent Application No. 2020-146209, filed on Aug. 31, 2020. The disclosures of these applications are hereby incorporated by reference in its entirety.

BACKGROUND

The present disclosure relates to a light emitting device, a method of manufacturing a light emitting device, a planar light source, and a liquid crystal display device.

A light emitting device equipped with a phosphor has been known. Such a light emitting device is manufactured, for example, by a method including: providing a phosphor cap sheet in which phosphor caps are linked using the same pitch as the array pitch of the circuit substrates of a substrate block; flip-chip mounting a plurality of semiconductor light emitting elements on the substrate block; laying the phosphor cap sheet over the substrate block on which the semiconductor light emitting elements have been mounted; and dividing the substrate block together with the phosphor cap sheet into individual semiconductor light emitting devices. Because such light emitting devices are prone to emission color nonuniformity, there is a need to reduce color nonuniformity. See, for example, Japanese Patent Publication No. 2013-118210.

SUMMARY

One of the objects of the present disclosure is to provide a method of manufacturing a light emitting device with reduced emission color nonuniformity.

A method of manufacturing a light emitting device according to one embodiment of the present disclosure includes: providing a first member that includes a base, a plurality of phosphor frames positioned on the base, and a light transmissive member disposed between the adjacent phosphor frames; disposing a light emitting element in the phosphor frames, wherein the light emitting element has an emission face and an electrode forming face located opposite to the emission face, the light emitting element comprises an electrode provided on the electrode forming face, and the light emitting element is disposed such that the emission face faces the base; and cutting the light transmissive member.

A light emitting device according to another embodiment of the present disclosure includes: a base, a phosphor frame positioned inward of edges of a lower face of the base, a light emitting element disposed in an area surrounded by the phosphor frame, and a light transmissive member covering the edges of the lower face of the base and outer lateral faces of the phosphor frame.

According to certain embodiments of the present disclosure, a light emitting device with reduced emission color nonuniformity can be provided.

BRIEF DESCRIPTION OF THE DRAWINGS

FIG. 14 is a schematic diagram (part 12) showing a state in the light emitting device manufacturing process related to the first embodiment.

DETAILED DESCRIPTION

Figure 1:
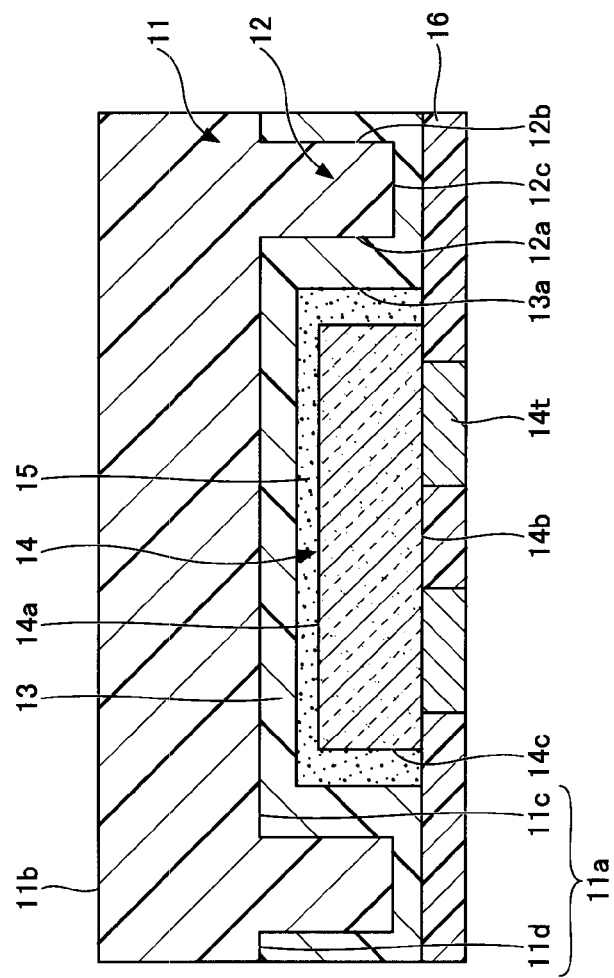
FIG. 1 is a cross-sectional view illustrating a light emitting device related to a first embodiment.

Certain embodiments of the present invention will be explained below with reference to the accompanying drawings. In the description below, terms indicating specific directions or positions (e.g., "upper," "lower," and other terms including and related to these) might be used. These terms, however, are merely used in order to make the embodiments in the drawings being referenced more easily understood, and the meanings of these terms are not intended to limit the technical scope of the present invention. The same reference numerals shown in a number of drawings designate the same or equivalent parts or members.

In the present disclosure, "parallel" refers to a case in which two straight lines, sides, planes, or the like, form an angle of 0° plus or minus about 5° unless otherwise specifically noted. In the present disclosure, "perpendicular" or "orthogonal" refers to a case in which two straight lines, sides, planes, or the like, form an angle of 90° plus or minus about 5° unless otherwise specifically stated.

The embodiments described below are provided to give shape to the technical ideas of the present invention, and are not intended to limit the present invention. The sizes and shapes of, materials for, and relative positions of the members shown in the drawings are not intended to limit the scope of the present invention to only those described unless otherwise noted, and are intended for illustration purposes. Moreover, what is explained in relation to one embodiment is also applicable to other embodiments or their variations. The sizes of and relative positions of the members shown in the drawings might be exaggerated for clarity of explanation. Furthermore, for the purpose of not making the drawings excessively complex, schematic diagrams omitting certain elements might be used, or only a cut end face might be shown as a cross-sectional view.

First Embodiment

Light Emitting Device 10

Figure 2:
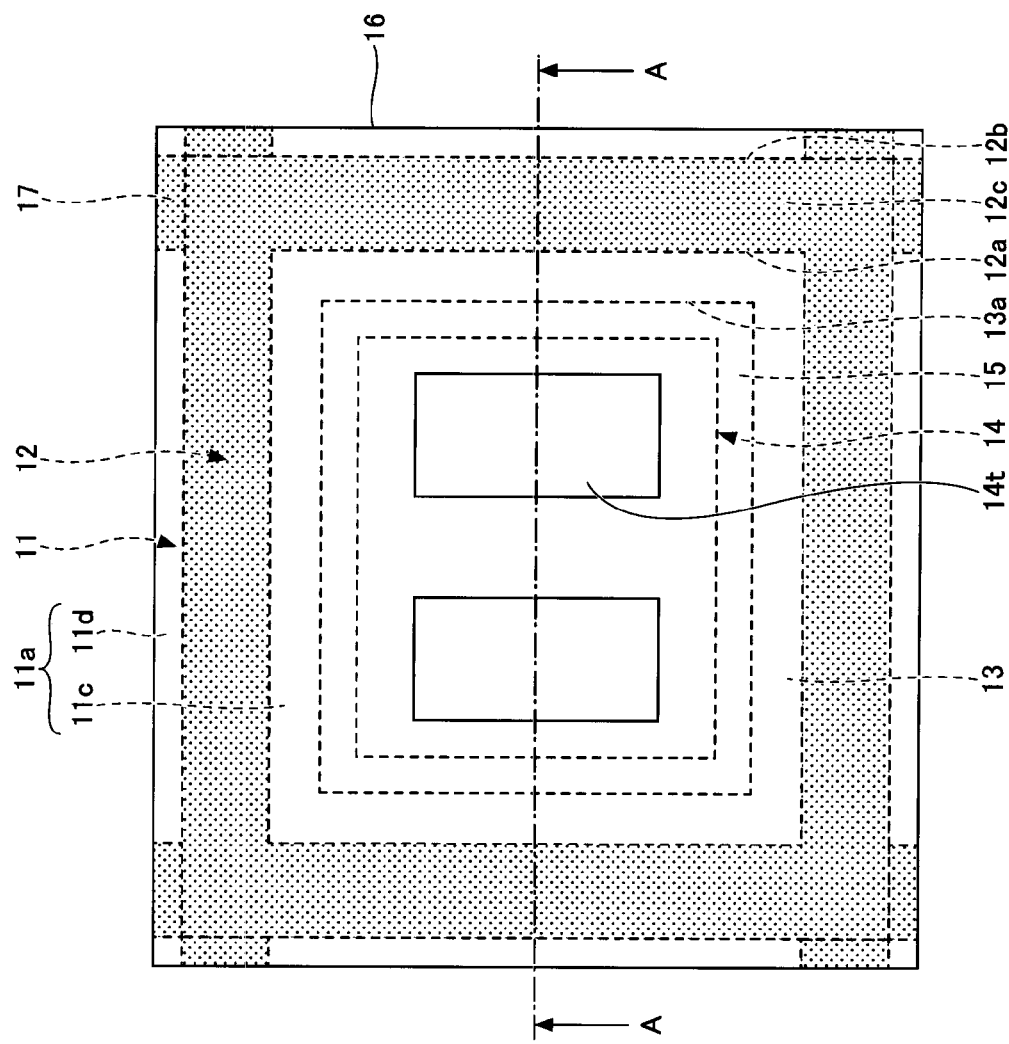
FIG. 2 is a bottom (lower face) view of the light emitting device related to the first embodiment.

FIG. 1 is a cross-sectional view illustrating a light emitting device related to a first embodiment. FIG. 2 is a bottom (lower face) view of the light emitting device related to the first embodiment. FIG. 1 is a cross section taken along line A-A in FIG. 2.

As shown in FIG. 1 and FIG. 2, the light emitting device 10 includes a base 11, a phosphor frame 12, a light transmissive member 13, and a light emitting element 14. The light emitting device 10 may further include an adhesive member 15 and/or a light reflecting member 16. The appearance of the light emitting device 10 is, for example, an approximately cubic shape or approximately rectangular cuboid shape. The upper face, the lower face, and the lateral faces of the light emitting device 10 are, for example, quadrangles, such as squares or rectangles.

The base 11, for example, is a sheet shaped member in which the first principal face 11a (the lower face in FIG. 1) and the second principal face 11b (the upper face in FIG. 1) are quadrangles, such as squares or rectangles. The phosphor frame 12 is a frame-shaped member protruding downwards from the first principal face 11a of the base 11. The phosphor frame 12 includes inner lateral faces 12a, outer lateral faces 12b, and an end face 12c.

In a bottom view of the base 11 and the phosphor frame 12, the phosphor frame 12 is picture frame (quadrangle ring) shaped, for example. However, the bottom view of the phosphor frame 12 may be ring shaped instead of picture frame (quadrangle ring) shaped. In other words, the opening of the phosphor frame 12 in a bottom view may be polygonal, such as a quadrangle, or circular.

A bottom view refers to viewing a subject from the direction normal to the first principal face 11a of the base 11.

In a bottom view, the first principal face 11a of the base 11 has a central part 11c surrounded by the phosphor frame 12 and an end part 11d located on the outside of the phosphor frame 12. In other words, the phosphor frame 12 is positioned inward of the end part 11d of the first principal face 11a of the base 11.

The light transmissive member 13 covers the central part 11c of the first principal face 11a of the base 11, the inner lateral faces 12a and the end face 12c of the phosphor frame 12. Furthermore, the light transmissive member 13 covers at least a portion of the end part 11d of the first principal face 11a of the base 11 and at least a portion of the outer lateral faces 12b of the phosphor frame 12 to partially constitute the lateral faces of the light emitting device 10. The light transmissive member 13 provides a recess 13a surrounded by the phosphor frame 12. The light transmissive member 13 covering the central part 11c of the first principal face 11a of the base 11 constitutes the bottom face of the recess 13a, and the light transmissive member 13 covering the inner lateral faces 12a of the phosphor frame 12 constitutes the inner lateral faces of the recess 13a.

The light emitting element 14 includes an emission face 14a and an electrode forming face 14b located opposite to the emission face 14a. A pair of electrodes 14t are formed on the electrode forming face 14b of the light emitting element 14. The light emitting element 14 is disposed in the recess 13a positioned in the area surrounded by the phosphor frame 12. Specifically, the light emitting element 14 is disposed in the recess 13a so as to face the emission face 14a to the bottom face of the recess 13a. For example, the light emitting element 14 is disposed in the recess 13a so as to allow the electrodes 14t to protrude downwards from the recess 13a. In the present disclosure, the face opposing the electrode forming face 14b is referred to as the "emission face" to make the present disclosure more easily understood. It is needless to say, however, that the light exiting the light emitting element 14 is not limited to that from the "emission face," i.e., the light also exits the lateral faces 14c of the light emitting element 14.

An adhesive member 15 is interposed between the light emitting element 14, i.e., the emission face 14a and the lateral faces 14c thereof, and the recess 13a, i.e., the bottom face and the inner lateral faces thereof. The light transmissive member 13 indirectly covers the emission face 14a and the lateral faces 14c of the light emitting element 14 via the adhesive member 15. However, the adhesive member 15 does not have to be disposed, and in that case, the emission face 14a and the lateral faces 14c of the light emitting element 14 are in contact with the bottom face and the inner lateral faces of the recess 13a. In other words, in this case, the light transmissive member 13 directly covers the emission face 14a and the lateral faces 14c of the light emitting element 14. The light transmissive member 13 covering the central part 11c of the first principal face 11a of the base 11 and the light transmissive member 13 covering the inner lateral faces 12a of the phosphor frame 12 can be disposed as needed, i.e., neither is indispensable.

A light reflecting member 16 can be provided as needed to cover the area of the electrode forming face 14b of the light emitting element 14 other than the areas where the electrodes 14t are disposed, as well as the adhesive member 15 and the light transmissive member 13 located around the electrode forming face 14b. In this case, the lower face of the light emitting device 10 is constituted of the lower face of the light reflecting member 16 and the lower faces of the electrodes 14t.

The end face 12c of the phosphor frame 12 is apart from the light reflecting member 16, and the light transmissive member 13 is interposed therebetween. The lateral faces of the light reflecting member 16, together with the lateral faces of the base 11 and the lateral faces of the light transmissive member 13, constitutes a part of the lateral faces of the light emitting device 10. The lateral faces of the light reflecting member 16, the lateral faces of the base 11, and the lateral faces of the light transmissive member 13 are coplanar, for example.

In a top view, protruded parts 17 are located on the outer lateral faces 12b of the phosphor frame 12 protruding towards the lateral faces of the light emitting device 10. In this embodiment, the protruded parts 17 in a bottom view are provided at the four corners of the phosphor frame 12, two per corner region. Each protruded part 17 in a bottom view is an extension of a part of end face 12c, and a portion of the protruded part 17 is exposed at the lateral face of the light emitting device 10. In other words, in a side view, the oblong end face of each protruded part 17 is exposed across a lateral face of the light emitting device 10 in the height direction. In this embodiment, the base 11, the phosphor frame 12, and the protruded parts 17 are monolithic. In other words, in this embodiment, the base 11, the phosphor frame 12, and the protruded parts 17 are formed of the same materials.

In the light emitting device 10, the light transmissive member 13 covering the outer lateral faces 12b of the phosphor frame 12 can improve the weather resistance of the phosphor. Furthermore, the presence of the end part 11d of the first principal face 11a of the base 11 can enhance the adhesion of the light transmissive member 13 to the base 11 and the phosphor frame 12.

Each constituent element of the light emitting device 10 will be explained in detail below.

Base 11, Phosphor Frame 12, and Protruded Parts 17

The materials used to form the base 11, the phosphor frame 12, and the protruded parts 17 absorb the light from a light emitting element 14 and convert it into light having a different wavelength, and include a phosphor. The materials used for the base 11, the phosphor frame 12 and the protruded parts 17 may include a base material, such as a light transmissive resin, glass, or ceramic, and a phosphor as a wavelength conversion material. Alternatively, the base 11, the phosphor frame 12 and the protruded parts 17 may be formed of a single crystal of a phosphor. For the base material, for example, a thermosetting resin, such as a silicone resin, silicone modified resin, epoxy resin, or phenol resin, a thermoplastic resin, such as a polycarbonate resin, acrylic resin, methylpentane resin, or polynorbornene resin, or aluminum oxide, can be used. Particularly, a silicone resin that is highly light resistant and highly heat resistance is suitable.

As for the phosphor, phosphors known in the art can be used. Examples of phosphors that can be excited by a blue or ultraviolet light emitting element include cerium-activated yttrium aluminum garnet based phosphors (YAG:Ce); cerium-activated lutetium aluminum garnet based phosphors (LAG:Ce); europium and/or chromium-activated nitrogen-containing calcium aluminosilicate based phosphors ($CaO-Al_2O_3-SiO_2$); europium-activated silicate based phosphors (($Sr,Ba)_2SiO_4$); nitride based phosphors, such as β-SiAlON phosphor, CASN based phosphors, and SCASN-based phosphors; KSF based phosphors ($K_2SiF_6$:Mn); sulfide based phosphors, and quantum dot phosphors.

By combining these phosphors and a light emitting element capable of emitting UV light and blue to green visible light, light emitting devices of various emission colors (e.g., a white light emitting device) can be produced. These phosphors can be used singly or in combination. When using multiple phosphors, they may be combined to form a single layer, or layers each containing a phosphor may be stacked. The materials for forming the base 11, the phosphor frame 12, and protruded parts 17 may contain various fillers for the purpose of adjusting the viscosity or facilitating light scattering.

Light Transmissive Member 13

For the light transmissive member 13, a light transmissive resin material can be used. For the light transmissive resin material, for example, one having, as a main component, a thermosetting resin, such as a silicone resin, silicone modified resin, epoxy resin, or phenol resin is preferable. The light transmissive member 13 preferably has a transmittance of at least 70%, more preferably at least 80%, even more preferably at least 90% with respect to the light from a light emitting element 14. The thickness of the light transmissive member 13 is preferably smaller than the thickness of a light emitting element 14. Specifically, the thickness of the light transmissive member 13 is preferably 0.01 mm to 0.15 mm, more preferably 0.01 mm to 0.1 mm, even more preferably 0.01 mm to 0.05 mm.

Light Emitting Element 14

A typical example of a light emitting element 14 is an LED (light emitting diode). The light emitting element 14, for example, includes an element substrate, such as sapphire or gallium nitride, and a semiconductor stack body. The semiconductor stack body includes an n-type semiconductor layer, a p-type semiconductor layer, an active layer interposed between these, and electrodes 14t electrically connected to the n-type semiconductor layer and the p-type semiconductor layer. The semiconductor stack body may include a nitride based semiconductor ($In_xAl_YGa_{1-X-Y}N$, $0 \le X$, $0 \le Y$, $X+Y \le 1$) capable of emitting light in the ultraviolet to visible spectrum.

The semiconductor stack body can include at least one emission layer capable of emitting light in the ultraviolet to visible spectrum described above. For example, the semiconductor stack body can include an emission layer capable of emitting light of one emission color or emission wavelength between the n-type semiconductor layer and the p-type semiconductor layer. The emission layer may be structured with a single active layer, such as in a double heterojunction or single quantum well (SQW) structure, or a group of active layers such as in a multiple quantum well (MQW) structure. The semiconductor stack body can have a plurality of emission layers.

For example, the semiconductor stack body may be a structure that includes a plurality of emission layers between an n-type semiconductor layer and a p-type semiconductor layer, or one that repeatedly stacks a structure that successively includes an n-type semiconductor layer, an emission layer, and a p-type semiconductor layer. The multiple emission layers may include an active layer having a different or the same emission color or wavelength.

The same emission color may include a range of colors that may be deemed as the same emission color for the purpose of use, for example, the dominant wavelengths may have variations of about several nanometers. The combination of emission color or emission wavelength may be suitably selected. Examples of emission color combinations in the case in which the semiconductor stack body includes two emission layers include blue light and blue light, green light and green light, red light and red light, ultraviolet light and ultraviolet light, blue light and green light, blue light and red light, green light and red light, and the like.

The shape of the light emitting element 14 in a bottom view is typically a quadrangle. The length of one side of the quadrangular shape of the light emitting element 14 is, for example, 1000 μm at most. The vertical and lateral dimensions of the quadrangular light emitting element 14 may be 500 μm at most. Light emitting elements having vertical and lateral dimensions of 500 μm at most are inexpensively procurable. The vertical and lateral dimensions of a quadrangular light emitting element 14 may be 200 μm at most. Quadrangular shaped light emitting elements 14 with short sides have the advantages of producing high definition images and being useful in local dimming operations or the like when employed as a backlight unit of a liquid crystal display device.

A light emitting element in which both the vertical and lateral dimensions are 250 μm at most, in particular, has a smaller upper face area relative to the lateral faces through which a relatively large amount of light can exit. It can therefore tend to achieve batwing distribution characteristics. Here, batwing distribution characteristics broadly refer to the light distribution characteristics defined by the emission intensity distribution in which the emission intensity is higher at an absolute value angle greater than 0 degrees assuming that the optical axis perpendicular to the upper face of a light emitting element is 0 degrees.

Adhesive Member 15

For the adhesive member 15, a light transmissive adhesive can be used. Examples of light transmissive adhesives include resin materials having, as a main component, a thermosetting resin, such as a silicone resin, silicone modified resin, epoxy resin, or phenol resin. The transmittance of the light transmissive adhesive with respect to the light from a light emitting element 14 is preferably at least 70%, more preferably at least 80%, even more preferably at least 90%.

Light Reflecting Member 16

The light reflecting member 16 is a member capable of reflecting the light from a light emitting element 14, for example, a resin material containing a light scattering material. The reflectance of the light reflecting member 16 with respect to the light from a light emitting element 14 is preferably at least 70%, more preferably at least 80%, even more preferably at least 90%.

For the light reflecting member 16, a resin material having, as a main component, a thermosetting resin, such as a silicone resin, silicone modified resin, epoxy resin, or phenol resin, is preferably used as the base material. For the light scattering material (occasionally referred to as a filler) to be contained in the resin material, a white substance can be used. Specifically, titanium oxide, silicon oxide, zirconium oxide, potassium titanate, aluminum oxide, aluminum nitride, boron nitride, mullite or the like is preferable. The light scattering material can be in the forms of grains, fibers, or flakes, for example.

Method of Manufacturing Light Emitting Device 10

FIG. 3 to FIG. 14 are schematic diagrams each showing a state in a light emitting device manufacturing process related to a first embodiment. First, as shown in FIG. 3 to FIG. 9, a first member 110 is provided that includes a base 11, a plurality of phosphor frames 12 positioned on the base 11, and a light transmissive member 13 disposed between adjacent phosphor frames 12.

Figure 3:
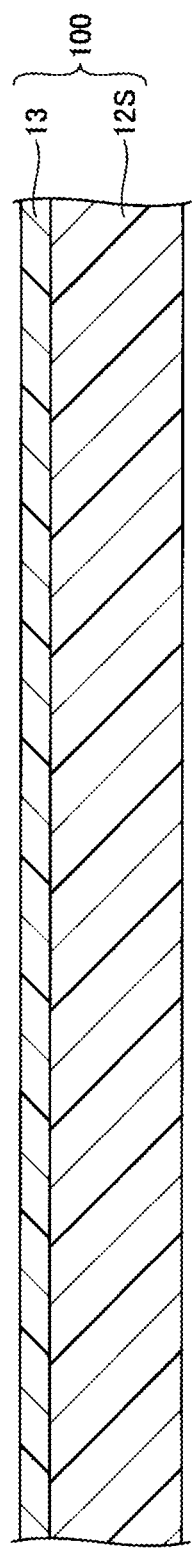
FIG. 3 is a schematic diagram (part 1) showing a state in a light emitting device manufacturing process related to the first embodiment.

Specifically, as shown in FIG. 3, a semi-cured stack body 100 in which a light transmissive member 13 is stacked on a phosphor layer 12S is provided. The stack body 100 can be formed, for example, by placing a film shaped light transmissive member 13 formed of a semi-cured light transmissive resin on a film shaped phosphor layer 12S formed of a semi-cured light transmissive resin containing a phosphor, and pressing the light transmissive member 13 against the phosphor layer 12S. A stack body 100 may alternatively be formed by spray coating a material for the light transmissive member 13 on a film shaped phosphor layer 12S formed of a semi-cured light transmissive resin containing a phosphor. Alternatively, a semi-cured stack body 100 in which a light transmissive member 13 is already stacked on a phosphor layer 12S may be purchased. The upper face and the lower face of the stack body 100 are flat surfaces without any protrusion or depression.

Figure 4:
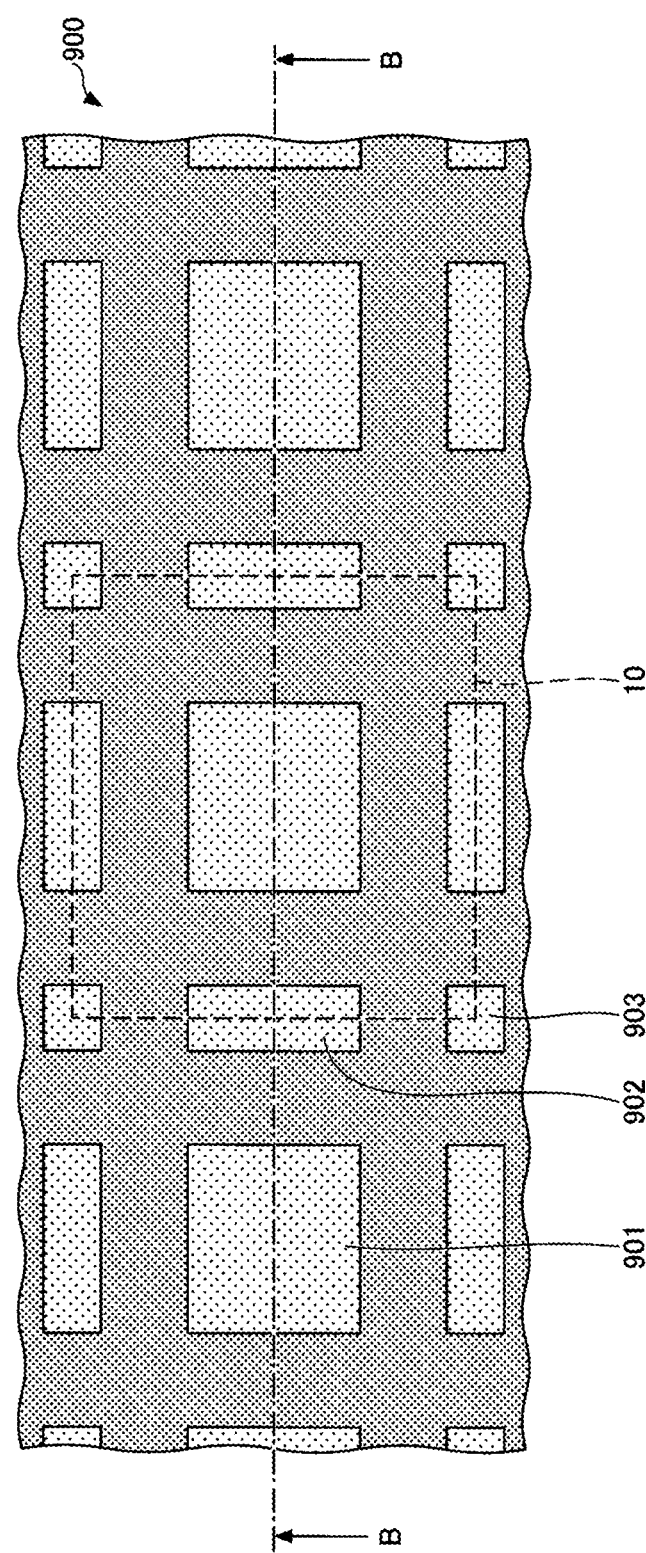
FIG. 4 is a schematic diagram (part 2) showing a state in the light emitting device manufacturing process related to the first embodiment.
Figure 5:
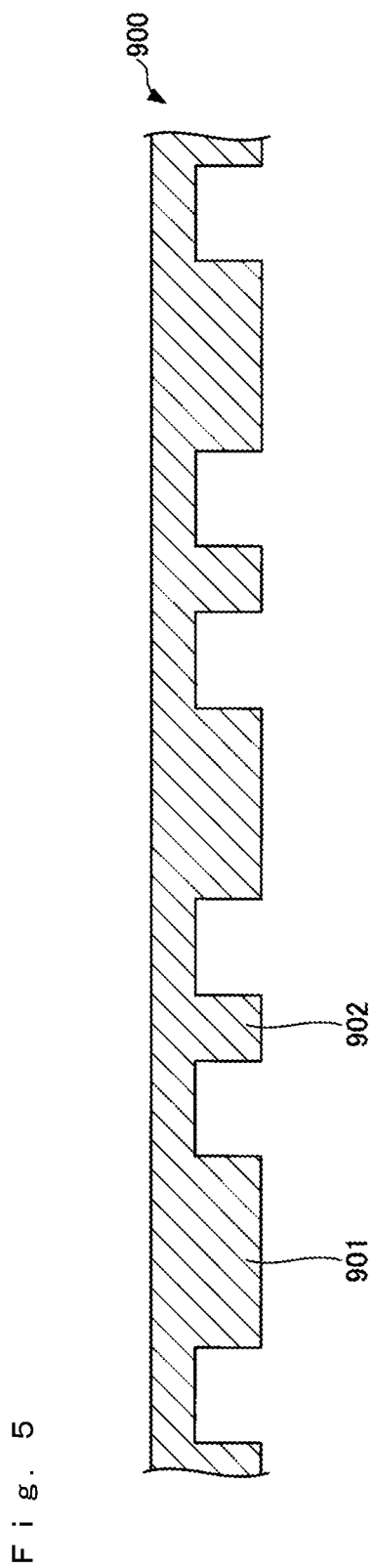
FIG. 5 is a schematic diagram (part 3) showing a state in the light emitting device manufacturing process related to the first embodiment.
Figure 6:
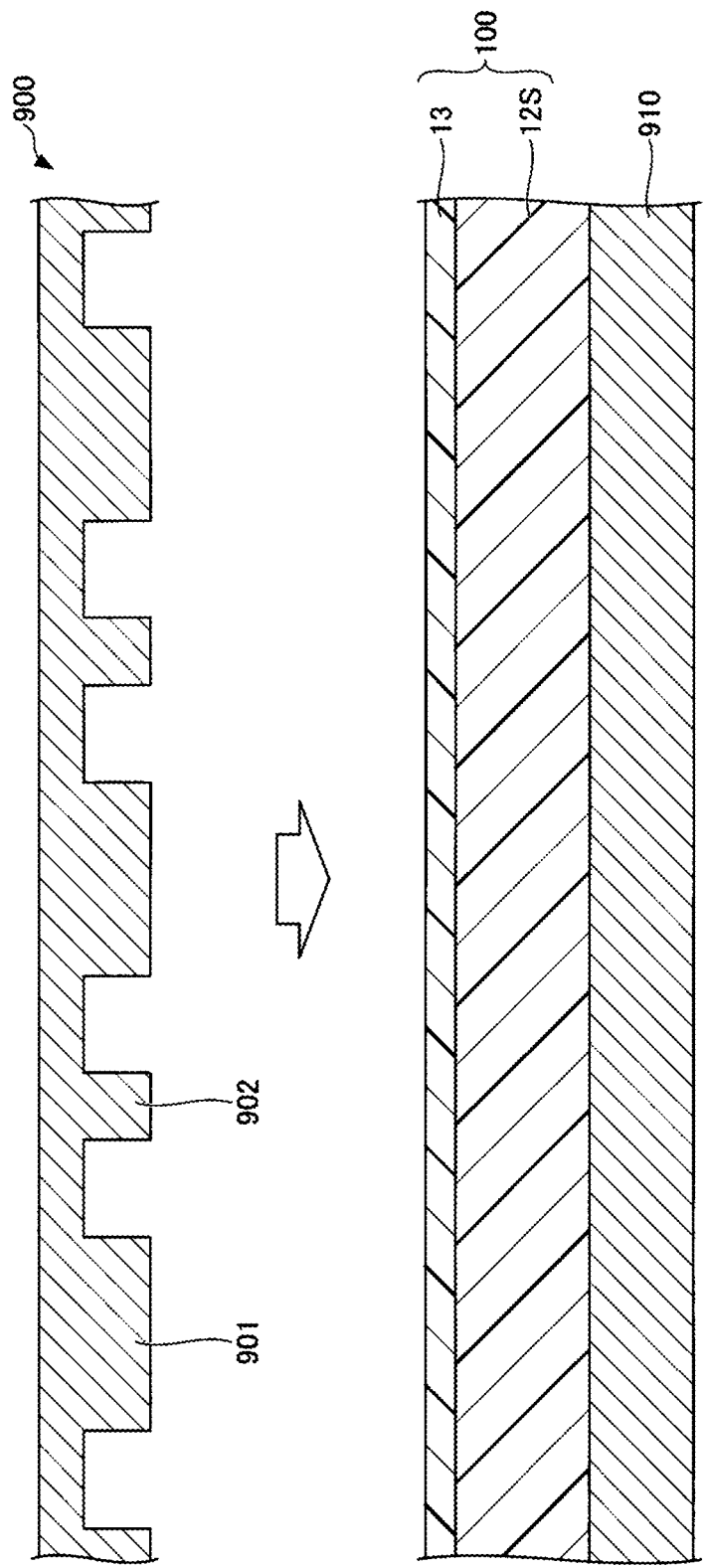
FIG. 6 is a schematic diagram (part 4) showing a state in the light emitting device manufacturing process related to the first embodiment.

Subsequently, the upper die 900 shown in FIG. 4 and FIG. 5 and the lower die 910 shown in FIG. 6 are provided. FIG. 4 shows the upper die 900 viewed from the side having protrusions (the side that faces the lower die 910), and FIG. 5 is a cross-sectional view taken along line B-B in FIG. 4. In FIG. 4, the area surrounded by broken lines denoted by reference numeral 10 represents the portion corresponding to a light emitting device 10.

As shown in FIG. 4, on the face of the upper die 900 that faces the lower die 910, protrusions 901 that are square shaped, for example, for forming recesses 13a are arranged in rows and columns at predetermined intervals. Furthermore, rectangular shaped protrusions 902 whose long sides are approximately the same length as a side of the protrusions 901 are disposed apart from and between the protrusions 901 adjacent in the up/down and left/right directions. Moreover, square shaped protrusions 903, each side being approximately the same length as a short side of the protrusions 902, are disposed apart from and between the protrusions 901 adjacent in the diagonal directions. In other words, the protrusions 903 are disposed apart from and between adjacent protrusions 902. The face of the lower die 910 that faces the upper die 900 is a flat surface without any protrusion or depression.

Figure 7:
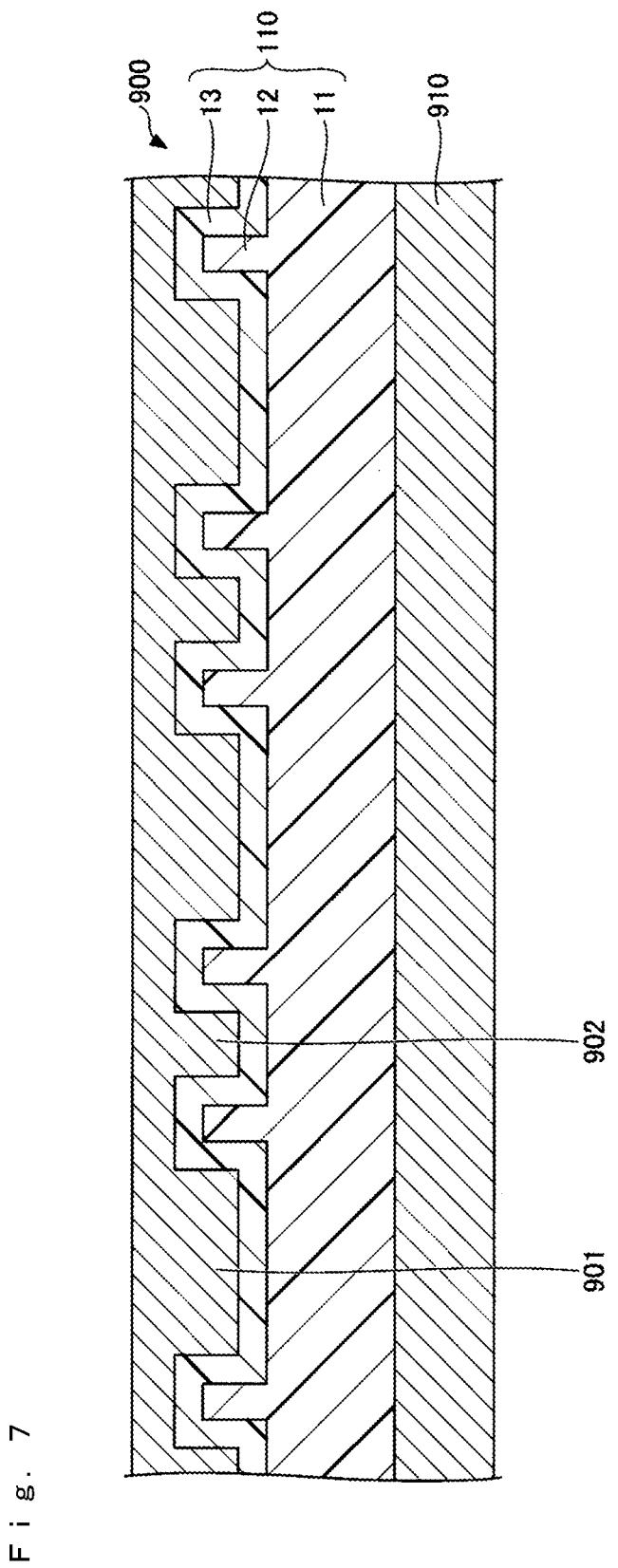
FIG. 7 is a schematic diagram (part 5) showing a state in the light emitting device manufacturing process related to the first embodiment.

A stack body 100 is molded by using the upper die 900 and the lower die 910. Specifically, by placing the stack body 100 on the lower die 910 as shown in FIG. 6 and pressing with the upper die 900 as shown in FIG. 7, the stack body 100 is deformed whereby a first member 110 including a base 11, phosphor frames 12, and a light transmissive member 13 is formed. In the process shown in FIG. 7, the excess material for the phosphor frames 12 is squeezed out in the periphery of the upper die 900 and the lower die 910. Subsequently, the phosphor frames 12 and the light transmissive member 13 are hardened.

Figure 8:
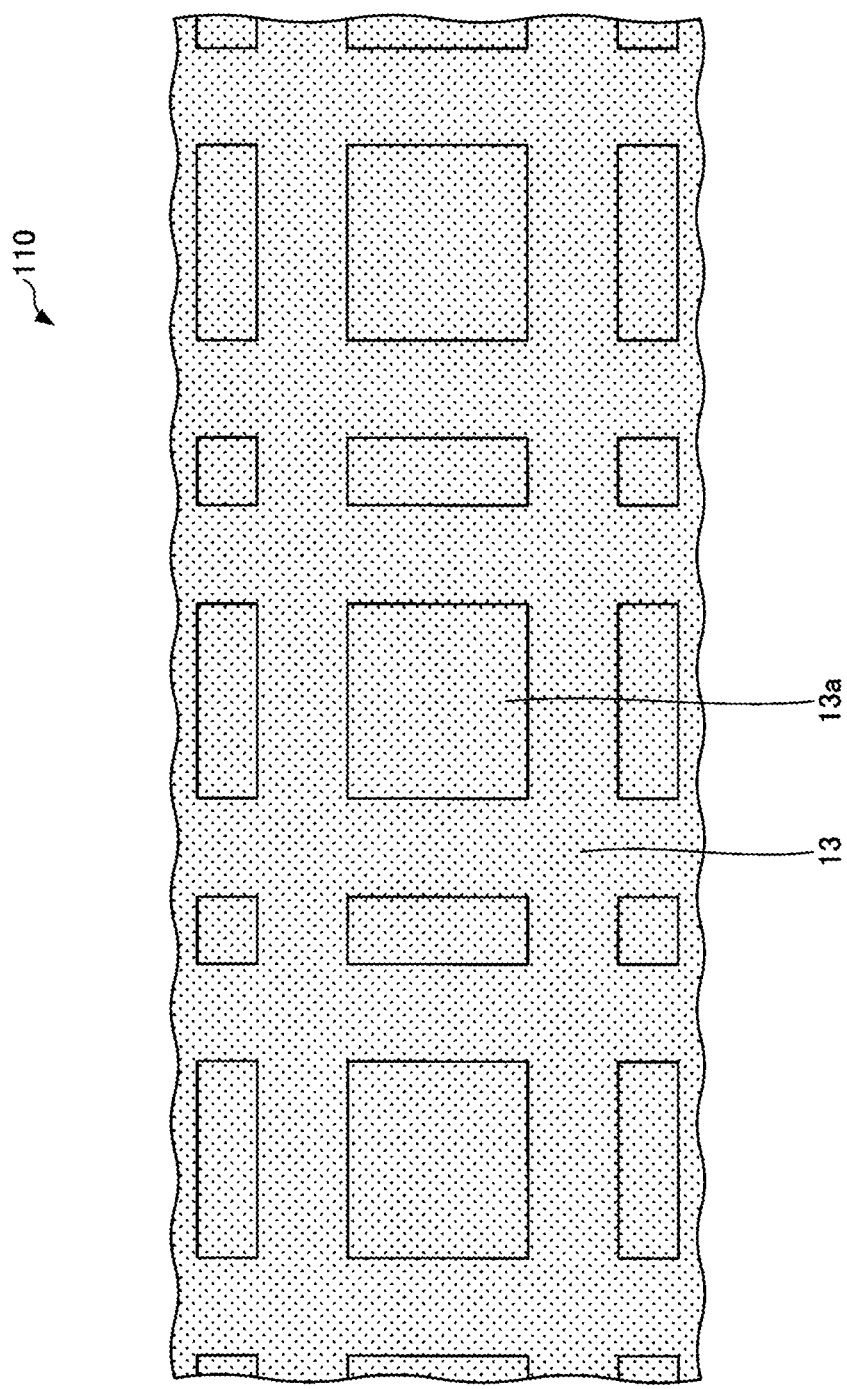
FIG. 8 is a schematic diagram (part 6) showing a state in the light emitting device manufacturing process related to the first embodiment.
Figure 9:
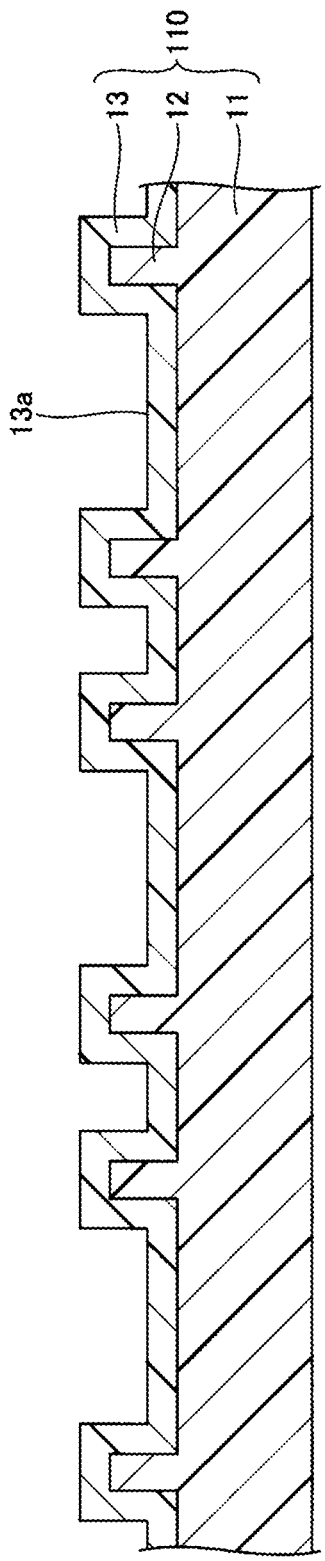
FIG. 9 is a schematic diagram (part 7) showing a state in the light emitting device manufacturing process related to the first embodiment.

FIG. 8 and FIG. 9 show the hardened first member 110 removed from the upper die 900 and the lower die 910. FIG. 8 is a plan view (top view) and FIG. 9 is a cross-sectional view. As shown in FIG. 8 and FIG. 9, the first member 110 has a base 11, a plurality of phosphor frames 12 on the base 11, and a light transmissive member 13 disposed between adjacent phosphor frames 12. In other words, the portions pressed by the protrusions 901, 902, and 903 of the upper die 900 become the base 11 and the light transmissive member 13 covering the base 11, and the other portions become the phosphor frames 12 and the light transmissive member 13 covering the phosphor frames 12. The base 11 is preferably thin. This is because the smaller the areas of the cut faces of the base 11 that will be exposed in the lateral faces of the light emitting devices 10 after being divided into pieces in the subsequent process shown in FIG. 12 discussed later, the better the weather resistance of the phosphor will be.

Figure 10:
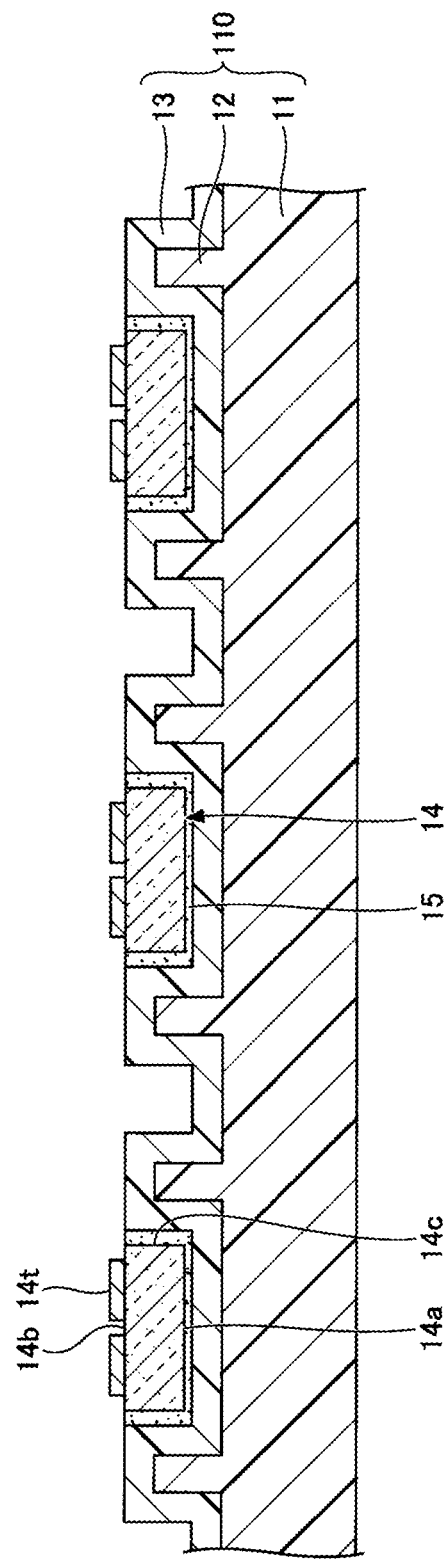
FIG. 10 is a schematic diagram (part 8) showing a state in the light emitting device manufacturing process related to the first embodiment.

Then as shown in FIG. 10, as many light emitting elements 14 as the phosphor frames 12 are provided, each having an emission face 14a, an electrode forming face 14b opposing the emission face 14a, and lateral faces 14c. The light emitting elements 14 are individually disposed in the phosphor frames 12 such that the emission faces 14a face the base 11. The light emitting elements 14 are disposed in the phosphor frames 12, for example, via an adhesive member 15 applied in the phosphor frames 12. The adhesive member 15 can be disposed, for example, by applying a light transmissive liquid material (e.g., resin) by potting. Hardening the adhesive member 15 can adhere the emission faces 14a and the lateral faces 14c of the light emitting elements 14 to the bottom and inner lateral faces of the light transmissive member 13 located in the phosphor frames 12. The light emitting elements 14 are preferably disposed such that the electrodes 14t protrude from the end faces 12c of the phosphor frames 12.

Figure 11:
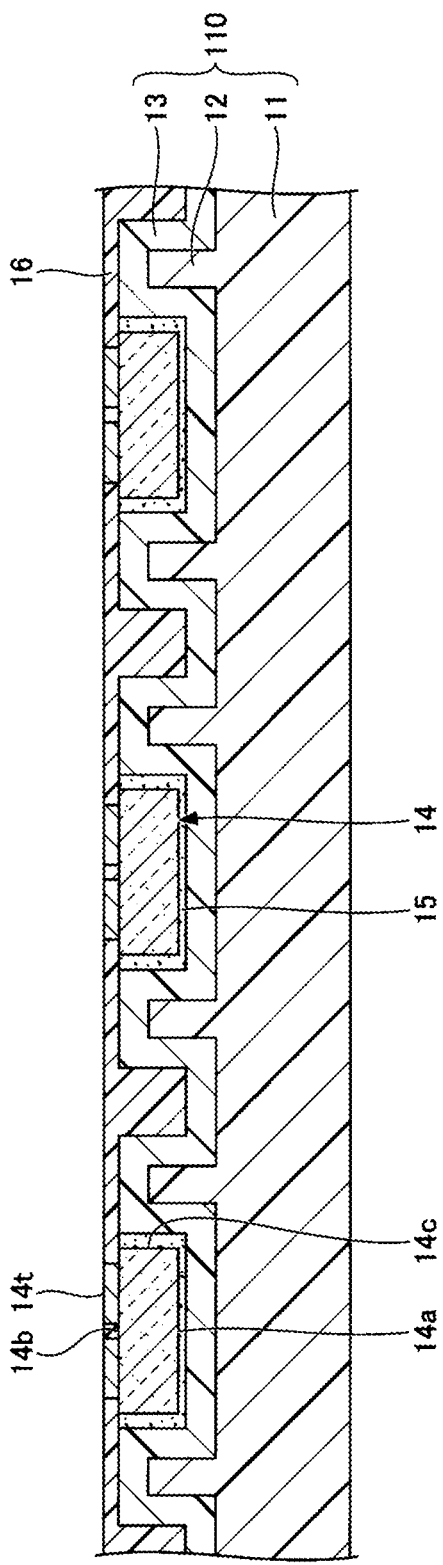
FIG. 11 is a schematic diagram (part 9) showing a state in the light emitting device manufacturing process related to the first embodiment.

Subsequently, as shown in FIG. 11, a light reflecting member 16 is disposed on the electrode forming face 14b side of the light emitting elements 14. Specifically, the light reflecting member 16 is formed to cover the upper face of the light transmissive member 13, the electrode forming faces 14b of the light emitting elements 14, and the lateral faces of the electrodes 14t of the light emitting elements 14 while the end faces of the electrodes 14t of the light emitting elements 14 are exposed. The light reflecting member 16 may be disposed on the electrode forming face 14b side of the light emitting elements 14 to embed the electrodes 14t on the electrode forming faces 14b, followed by partially removing the light reflecting member until the end faces of the electrodes 14t become exposed. The light reflecting member 16 can be formed by, for example, compression forming using a die, potting, coating, or the like. For example, mechanical polishing using a grinder, sand blasting, or the like can be employed to remove the light reflecting member 16 on the electrodes 14t.

Figure 12:
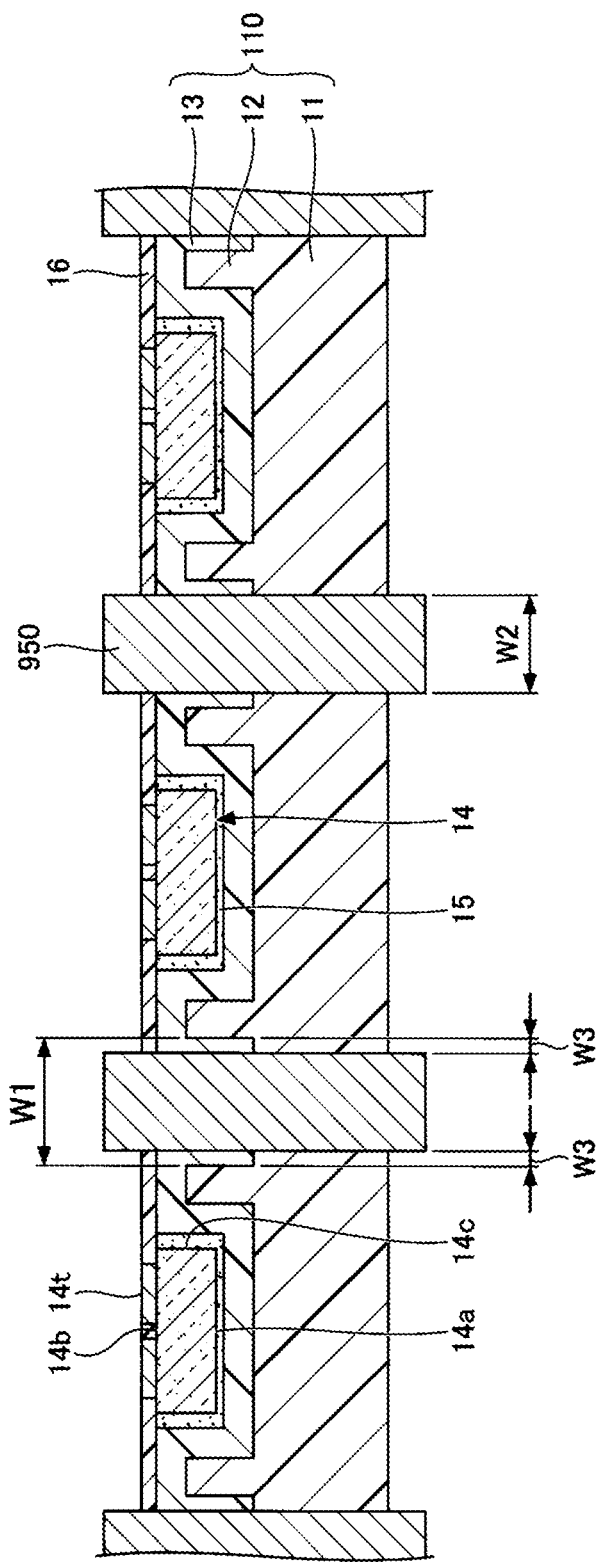
FIG. 12 is a schematic diagram (part 10) showing a state in the light emitting device manufacturing process related to the first embodiment.

Subsequently, as shown in FIG. 12, by cutting the base 11, the light transmissive member 13, and the light reflecting member 16 that are located between adjacent phosphor frames 12, the light emitting devices 10 shown in FIG. 14 can be obtained. The cutting is performed so as to retain the light transmissive member 13 that covers the outer lateral faces 12b of each phosphor frame 12. In other words, the phosphor frames 12 are not cut, but the light transmissive member 13 covering the outer lateral faces 12b of the phosphor frames 12 is invariably cut.

The base 11, the light transmissive member 13, and the light reflecting member 16 that are located between adjacent phosphor frames 12 can be cut by cutting, for example, using a blade 950 having a predetermined width as shown in FIG. 12. Cutting with a blade 950 removes the base 11, the light transmissive member 13, and the light reflecting member 16 that each have the width corresponding to the width of the blade 950. Cutting can be performed by a single cutting operation as shown in FIG. 12, or two or more cutting operations. When cutting by two cutting operations, the first cutting can form a groove from the light reflecting member 16 to a depth not reaching the lower end of the base 11, and the second cutting completes the cut by grinding deeper into the groove formed by the first cutting. For example, the light reflecting member 16 may be cut in the first cutting, and the base 11 in the second cutting.

When cutting by three cutting operations, the first cutting can from a groove from the light reflecting member 16 side to a depth not reaching the lower end of the base 11, the second cutting grinds deeper into the groove made in the first cutting, and the third cutting completes the cut by grinding deeper into the groove made by the second cutting. Cutting can be done similarly in the case of involving four or more cutting operations.

Figure 13:
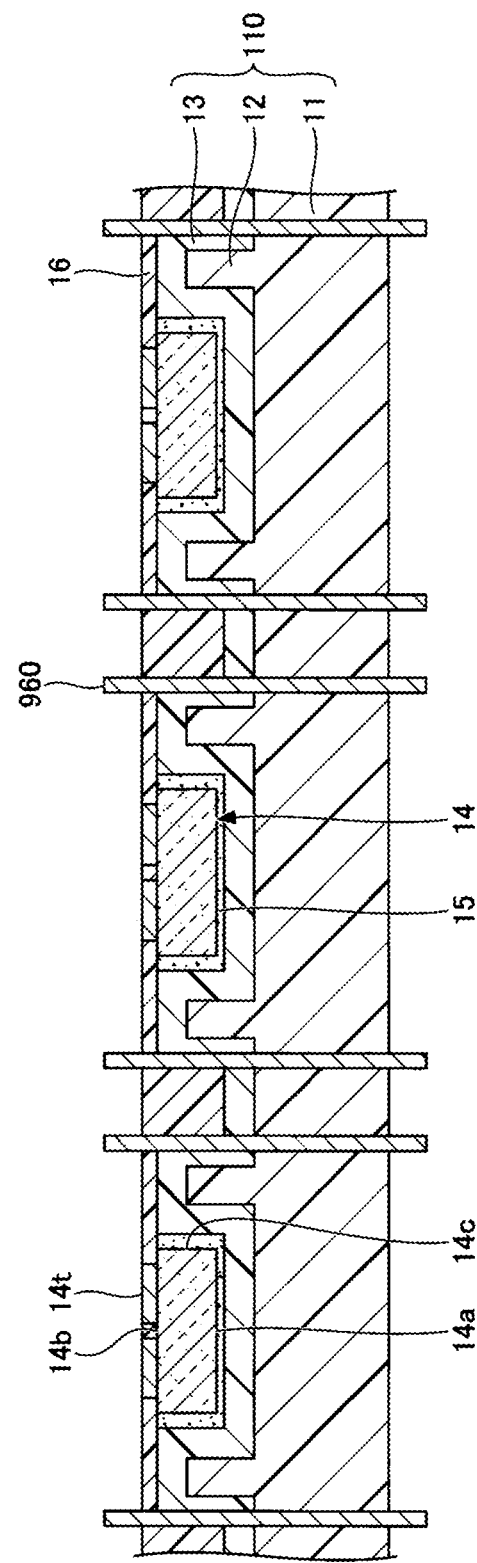
FIG. 13 is a schematic diagram (part 11) showing a state in the light emitting device manufacturing process related to the first embodiment.

As shown in FIG. 13, two different locations between one phosphor frame 12 and adjacent phosphor frame 12 may be cut by cutting using a narrower width blade 960 than the blade 950. Cutting can be completed by a single cutting operation or several cutting operations in this case as well. Cutting may be performed at several locations simultaneously or at different times. Cutting can be initiated from the light reflecting member 16 or the base 11 of the first member 110.

In FIG. 12, the width W1 between two opposite outer lateral faces of adjacent phosphor frames 12 is about 0.2 to 0.3 mm, for example. In this case, for example, a blade 950 having the width W2 of 0.15 mm can be used. For example, in the case in which the width W1 is 0.25 mm and the width W2 is 0.15 mm, the width W3 will be 0.05 mm after evenly cutting the light transmissive member 13 covering the outer lateral faces of the phosphor frames 12. Using a larger width blade can make the width W3 to be about 0.01 mm.

If the lateral faces of a light emitting device are constituted by cutting a phosphor layer in half, an uneven cut position could result in different widths between the right side and the left side of the phosphor layer that compose the lateral faces of the light emitting devices. In this case, the optical path lengths of the light passing through the phosphor layer would differ between the right side and the left side of the light emitting device to cause emission color nonuniformity.

In contrast, in the case of a method of manufacturing a light emitting device 10, the phosphor frames 12 are not cut, but the light transmissive member 13 covering the outer lateral faces 12b of the phosphor frames 12 is invariably cut in the process of dividing the block into multiple light emitting devices 10 (see FIG. 12 and FIG. 13). If the cut position is shifted, the widths of the light transmissive member 13 constituting the lateral faces of a light emitting device 10 might differ between the left side and the right side, but the widths of the phosphor frame 12 on both sides remain even. This as a result can make the optical path lengths of the light passing through the phosphor frame 12 on the left and right sides of the light emitting device 10 substantially identical, thereby reducing emission color nonuniformity.

Furthermore, because the light reflecting member 16 included in a light emitting device 10 is positioned only at the lower face of the light emitting device, not covering the outer lateral faces of the light transmissive member 13, the extraction of light from the light emitting element 14 can be increased.

Moreover, in the light emitting device 10, the light transmissive member 13 covering the outer lateral faces 12b of the phosphor frame 12 can improve the phosphor's weather resistance. Furthermore, the presence of the end part 11d of the first principal face 11a of the base 11 can improve the adherence of the light transmissive member 13 to the base 11 and the phosphor frame 12.

Variations of First Embodiment

As some of the variations of the first embodiment, light emitting devices having different structures from that of the first embodiment will be discussed. In the description of the variations of the first embodiment, the same constituent elements already explained might be omitted.

Figure 15:
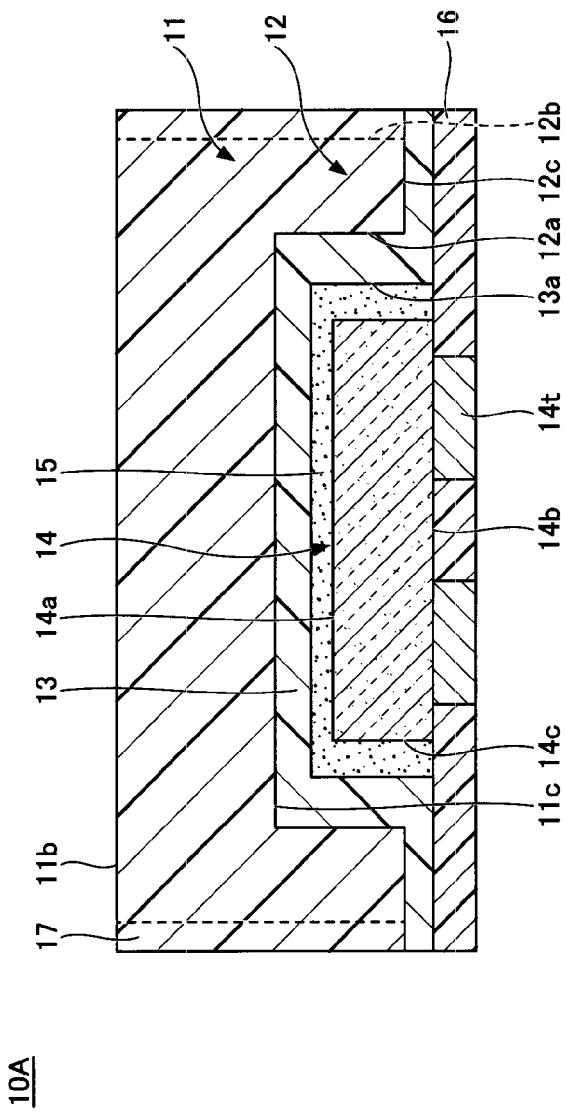
FIG. 15 is a cross-sectional view illustrating a light emitting device related to Variation 1 of the first embodiment.
Figure 16:
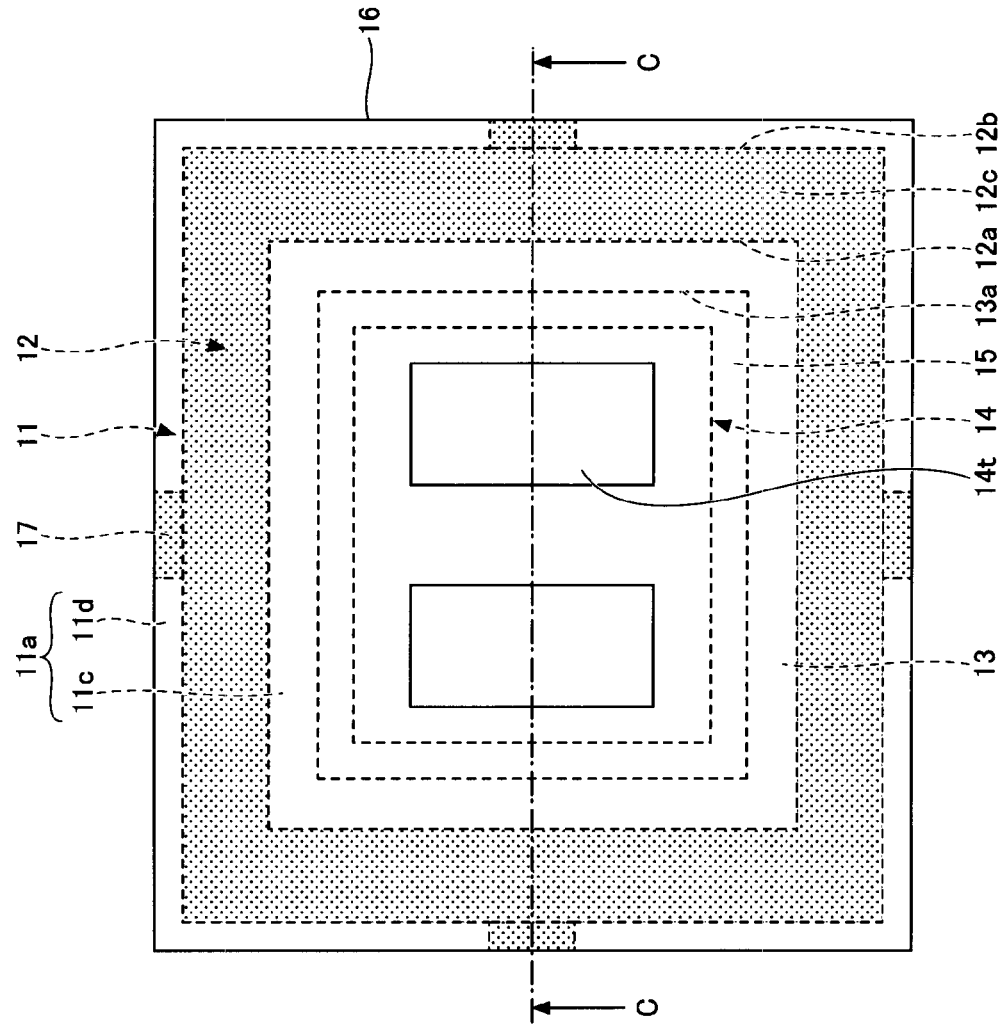
FIG. 16 is a bottom (lower face) view of the light emitting device related to Variation 1 of the first embodiment.

FIG. 15 is a cross-sectional view of a light emitting device related to Variation 1 of the first embodiment. FIG. 16 is a bottom (lower face) view of the light emitting device related to Variation 1 of the first embodiment. FIG. 15 is a cross section taken along line C-C in FIG. 16.

As shown in FIG. 15 and FIG. 16, the light emitting device 10A, similar to the light emitting device 10, includes protruded parts 17 on the outer lateral faces 12b of the phosphor frame 12. The protruded pats 17 protrude towards the lateral faces of the light emitting device 10A. Unlike the light emitting device 10, however, the protruded parts 17 in the light emitting device 10A are respectively disposed approximately at the centers of the four sides that constitute the outer lateral faces 12b of the phosphor frame 12, one per side, in a bottom view. In other words, each protruded part 17 in a bottom view is disposed at the midpoint between two adjacent corners of the rectangular phosphor frame 12. In a side view, the oblong end face of each protruded part 17 is exposed across a lateral face of the light emitting device 10 in the height direction.

As such, the light emitting device 10A has four protruded parts 17 as compared to 8 protruded parts in the light emitting device 10. Exposure of the protruded parts 17 at the lateral faces of a light emitting device might allow the phosphor particles contained in the protruded parts 17 to be exposed at the lateral faces of the light emitting device, which can reduce the weather resistance of the phosphor particles. Accordingly, it is preferable to reduce the locations in the lateral faces of the light emitting device where protruded parts 17 are exposed. In other words, the light emitting device 10A, which has reduced locations in the lateral faces of the light emitting device where the protruded parts 17 are exposed than that of the light emitting device 10, is superior to the light emitting device 10 in terms of the weather resistance of the phosphor particles.

Figure 17:
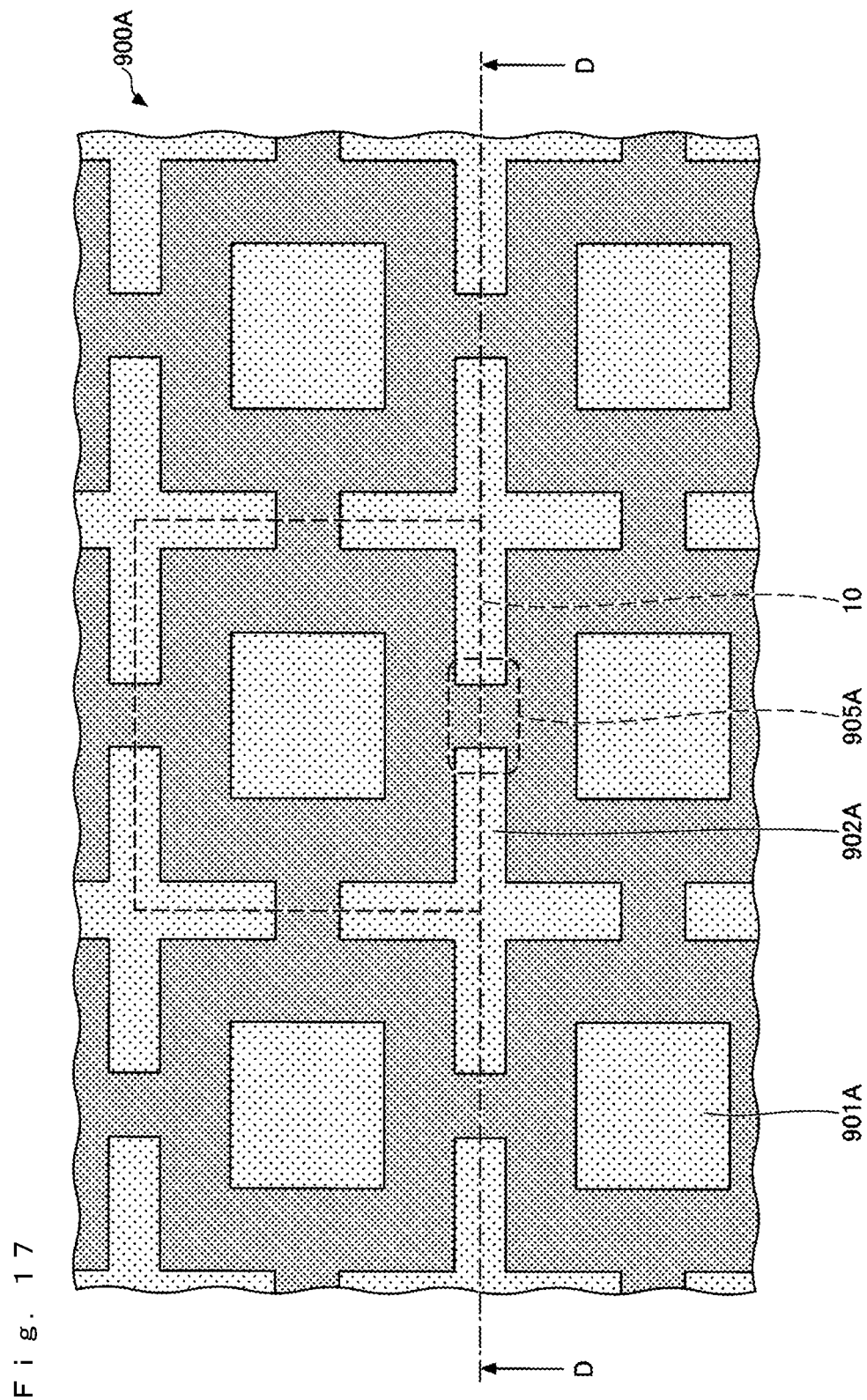
FIG. 17 is a bottom view of an upper die related to Variation 1 of the first embodiment.
Figure 18:
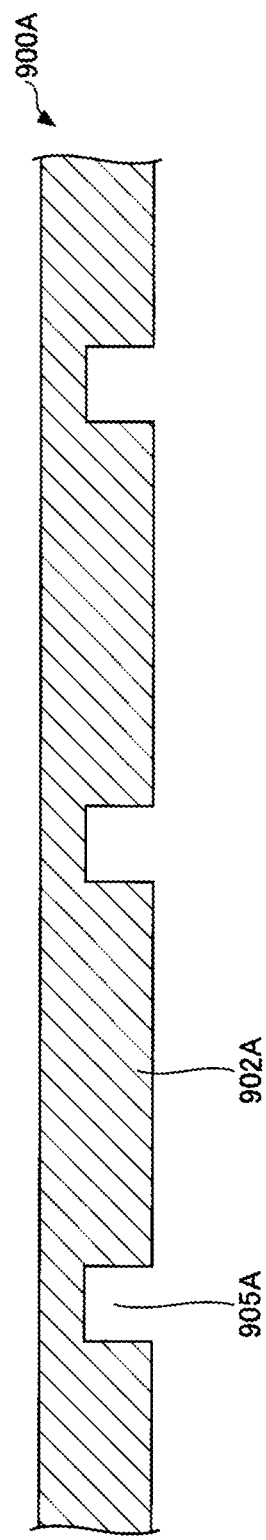
FIG. 18 is a cross-sectional view of the upper die related to Variation 1 of the first embodiment.

The protruded parts 17 can be formed at the locations shown in FIG. 16 by using the upper die 900A shown in FIG. 17 and FIG. 18. FIG. 17 shows the face of the upper die 900A that has protrusions (the face that faces the lower die 910), and FIG. 18 is a cross-sectional view taken along line D-D in FIG. 17.

As shown in FIG. 17, square shaped protrusions 901A, for example, for forming recesses 13a are arranged in rows and columns at predetermined intervals on the surface of the upper die 900A that faces the lower die. Furthermore, cross shaped protrusions 902A are arranged in rows and columns at predetermined intervals so as to be positioned between the protrusions 901A adjacent in diagonal directions, but apart from the protrusions 901A. Around each protrusion 901A, gaps 905A are provided at four locations between adjacent protrusions 902A, and the protruded parts 17 will be formed at the locations corresponding to the gaps 905A. The gaps 905A are located to straddle the lines vertically and laterally connecting the centers of the protrusions 901A in a bottom view, for example.

Figure 19:
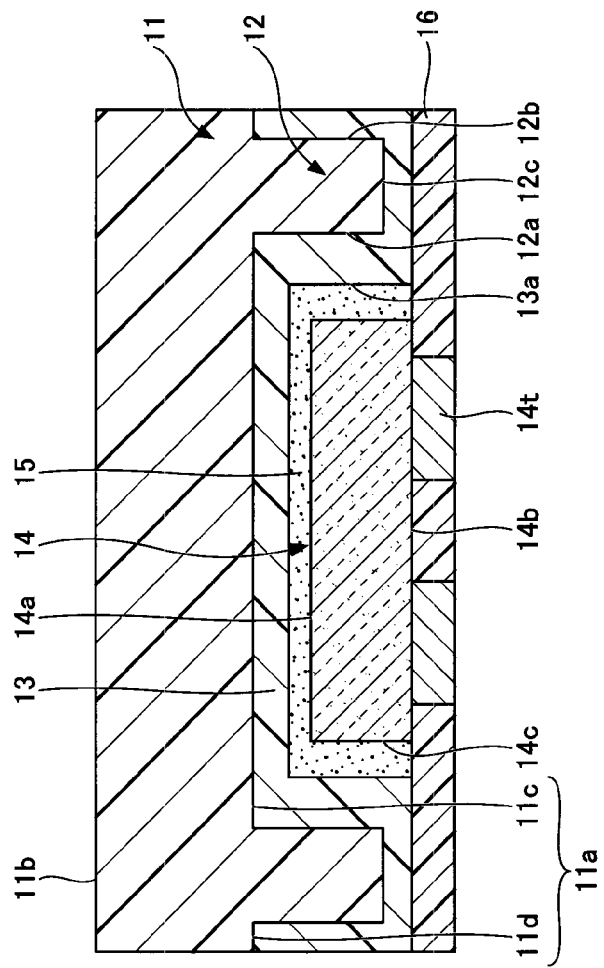
FIG. 19 is a cross-sectional view illustrating a light emitting device related to Variation 2 of the first embodiment.
Figure 20:
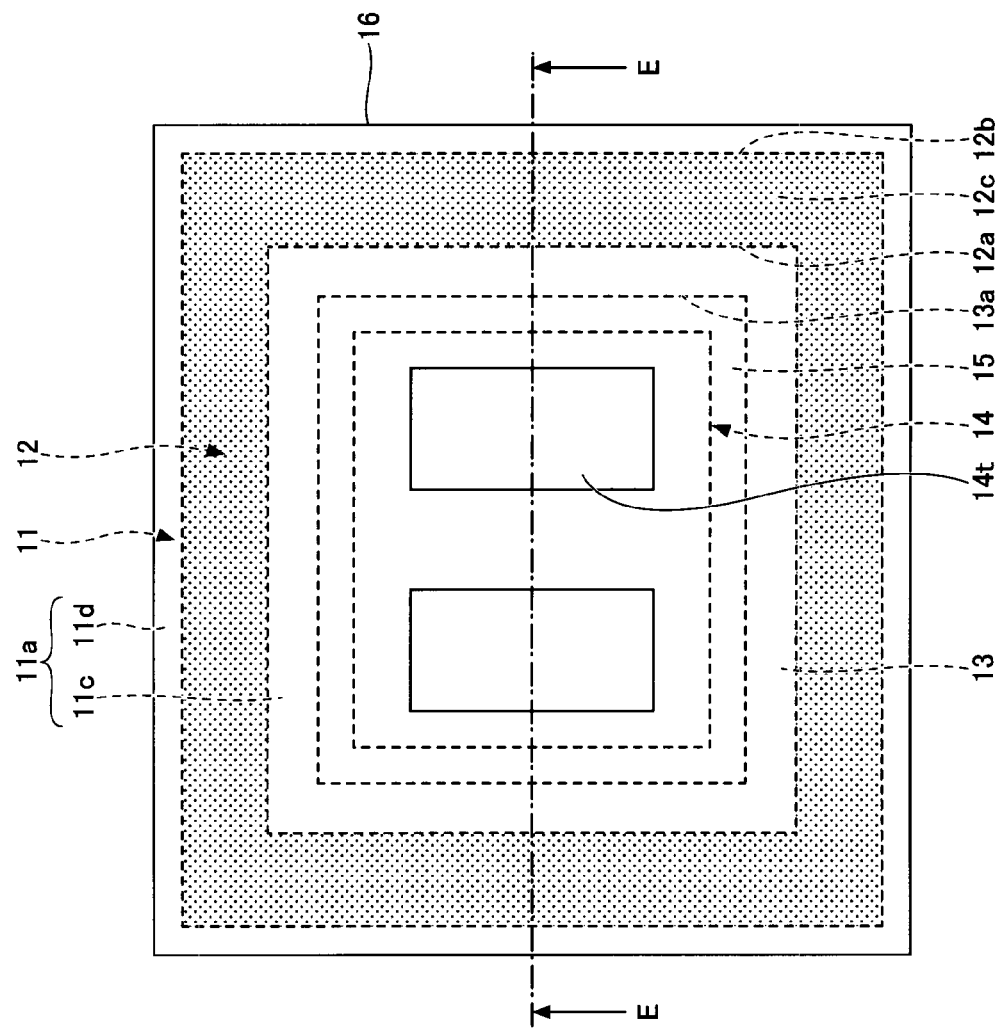
FIG. 20 is a bottom (lower face) view of the light emitting device related to Variation 2 of the first embodiment.

FIG. 19 is a cross-sectional view illustrating a light emitting device related to Variation 2 of the first embodiment. FIG. 20 is a bottom (lower face) view of the light emitting device related to Variation 2 of the first embodiment. FIG. 19 is a cross section taken along line E-E in FIG. 20.

As shown in FIG. 19 and FIG. 20, the light emitting device 10B, unlike the light emitting device 10 and the light emitting device 10A, the outer lateral faces 12b of the phosphor frame 12 have no protruded part 17 that protrudes towards any lateral face of the light emitting device 10B.

The light emitting device 10B has no protruded part 17 as compared to the eight and four protruded parts 17 provided in the emitting devices 10 and 10A, respectively. As described earlier, exposure of the protruded parts 17 at the lateral faces of a light emitting device might lead to exposure of the phosphor particles contained in the protruded parts 17 at the lateral faces of the light emitting device, which can reduce the weather resistance of the phosphor particles. It is thus preferable to reduce the locations in the lateral faces of the light emitting device where the protruded parts 17 are exposed. The light emitting device 10B is superior to the light emitting device 10A in terms of the weather resistance of the phosphor particles because phosphor-containing member is not exposed across the lateral faces of the light emitting device 10B in the height direction.

Figure 21:
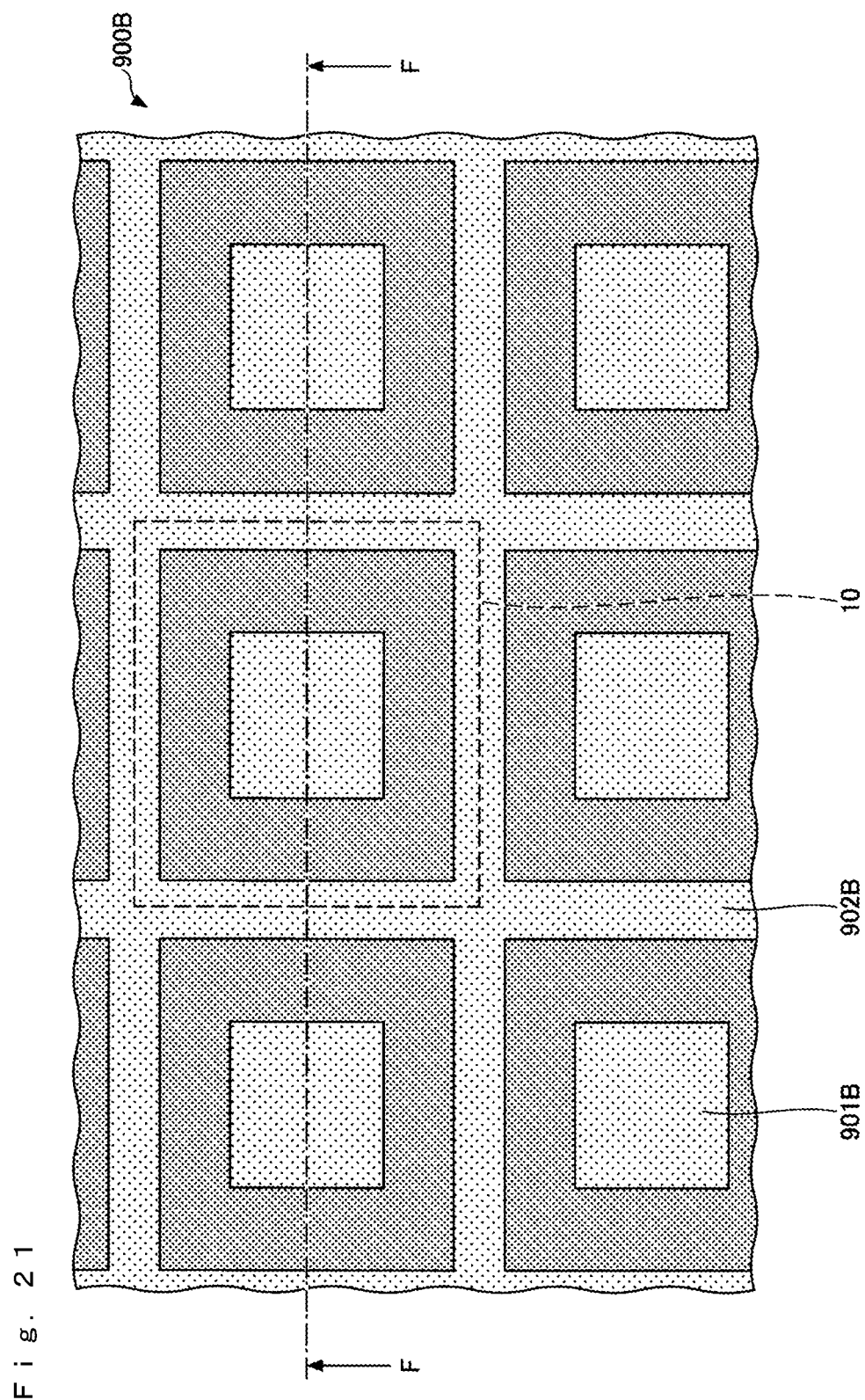
FIG. 21 is a bottom view of an upper die related to Variation 2 of the first embodiment.
Figure 22:
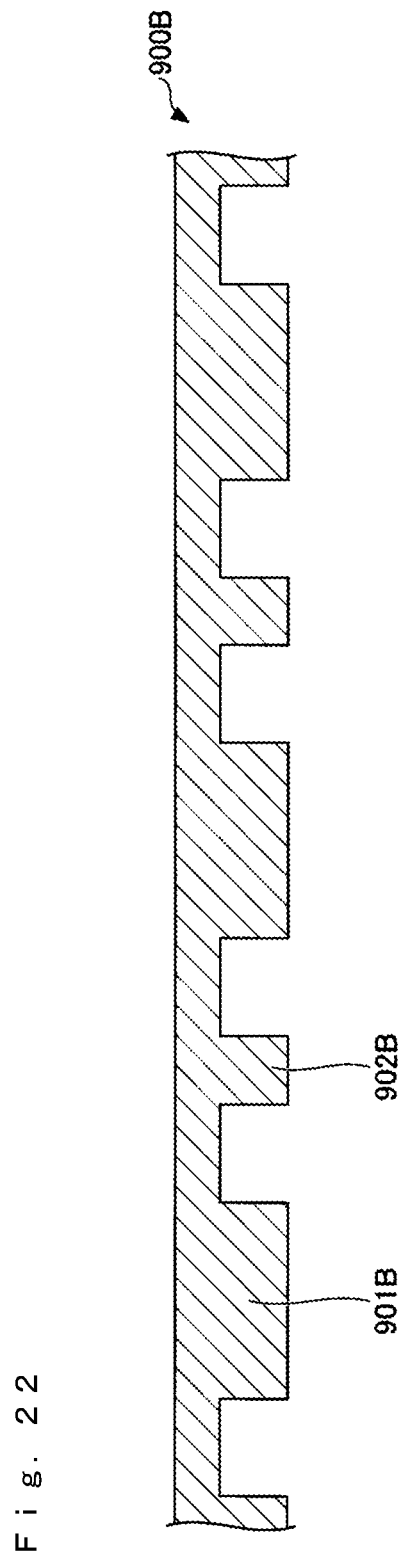
FIG. 22 is a cross-sectional view of the upper die related to Variation 2 of the first embodiment.

The upper die 900B shown in FIG. 21 and FIG. 22, for example, can be used to create no protruded part 70 exposed at the lateral faces of the light emitting device 10. FIG. 21 shows the face of the upper die 900B that has protrusions (the face that faces the lower die 910), and FIG. 22 is a cross-sectional view taken along line F-F in FIG. 21. As shown in FIG. 21, on the face of the upper die 900B that faces the lower die 910, protrusions 901B for forming recesses 13a, which are square shaped, for example, are arranged in rows and columns at predetermined intervals. Furthermore, protrusions 902B forming a grid shape are provided to surround the individual protrusions 901B, but apart from the protrusions 901B. Because the protrusions 902B forming a grid shape are continuously formed with no depressed part, no protruded part 17 that would be exposed at the lateral faces of the light emitting device 10 will be formed.

Figure 23:
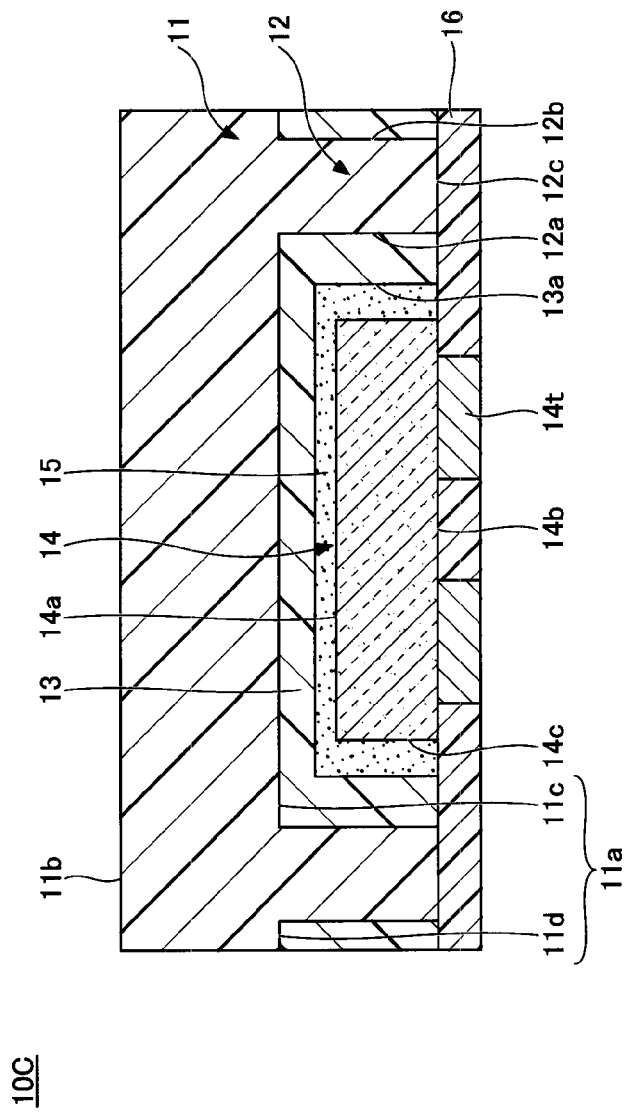
FIG. 23 is a cross-sectional view illustrating a light emitting device related to Variation 3 of the first embodiment.

FIG. 23 is a cross-sectional view of a light emitting device related to Variation 3 of the first embodiment. As shown in FIG. 23, the light emitting device 10C primarily differs from the light emitting device 10 (see FIG. 1) such that the light transmissive member 13 is not disposed at the end face 12c of the phosphor frame 12, and the end face 12c of the phosphor frame 12 is in contact with the light reflecting member 16.

As shown in FIG. 1 or the like, interposing a light transmissive member 13 between the end face 12c of the phosphor frame 12 and the light reflecting member 16 can improve the adhesion between the end face 12c of the phosphor frame 12 and the light reflecting member 16. As shown in FIG. 23, the end face 12c of the phosphor frame 12 can be in contact with the light reflecting member 16 without interposing the light transmissive member 13. This allows the entire light from the light emitting element to pass through the phosphor frame, thereby reducing emission color nonuniformity.

Figure 24:
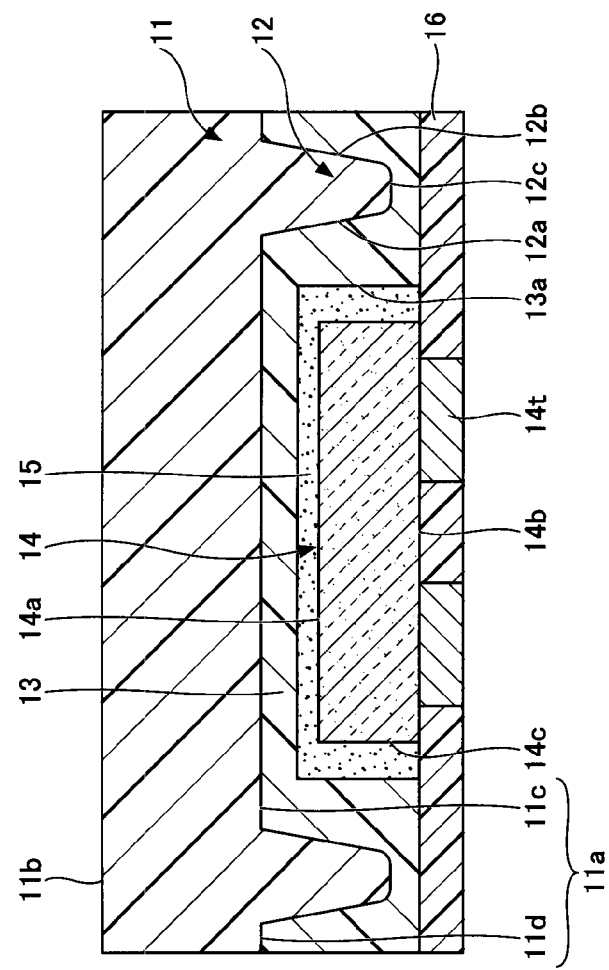
FIG. 24 is a cross-sectional view illustrating a light emitting device related to Variation 4 of the first embodiment.

FIG. 24 is a cross-sectional view of a light emitting device related to Variation 4 of the first embodiment. As shown in FIG. 24, the light emitting device 10D primarily differs from the light emitting device 10 (see FIG. 1) such that the cross-sectional shape of the wall part of the phosphor frame 12 is approximately trapezoidal whose width narrows as the distance from the first principal face 11a of the base 11 increases as compared to the rectangular cross-sectional shape of the wall part of the phosphor frame 12 of the light emitting device 10. The cross-sectional shape of the wall part of the phosphor frame 12 does not have to be a complete trapezoid, for example, the corners may be rounded or the end face 12c may be a curved surface, for example.

The upper die having trapezoid shaped depressions for forming the wall parts of the phosphor frames 12 can be used in order to achieve an approximately trapezoidal cross-sectional shape for the wall parts of the phosphor frames 12. A trapezoidal cross section of the wall of a phosphor frame 12 allows the first member 110 to be easily released from the upper die 900 from the state shown in FIG. 7 to the state shown in FIG. 9.

Figure 25:
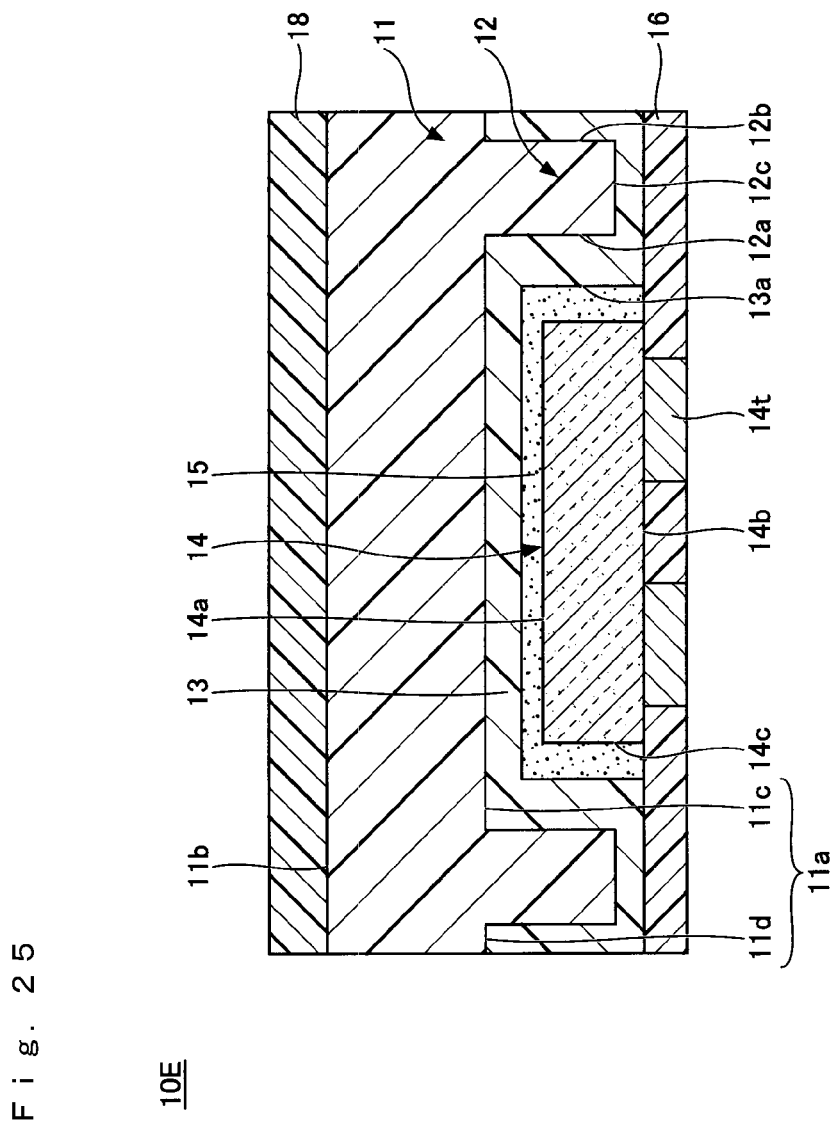
FIG. 25 is a cross-sectional view illustrating a light emitting device related to Variation 5 of the first embodiment.

FIG. 25 is a cross-sectional view of a light emitting device related to Variation 5 of the first embodiment. As shown in FIG. 25, the light emitting device 10E primarily differs from the light emitting device 10 (see FIG. 1) such that a light reflecting layer 18 is disposed on the second principal face 11b (the upper face in FIG. 25) that opposes the face on which the phosphor frame 12 of the base 11 is provided. For example, the light reflecting layer 18 can be formed on the second principal face 11b of the base 11 between the processes shown in FIGS. 11 and 12. Providing a light reflecting layer 18 on the second principal face 11b of the base 11 can reduce the light advancing upward from the light emitting element 14 to thereby increase the amount of light laterally extracted. For the light reflecting layer 18, for example, similar materials to those described as examples for the light reflecting member 16 can be used. The light reflecting layer 18 can be formed, for example, by compression forming using a die, potting, coating, or the like.

Figure 26:
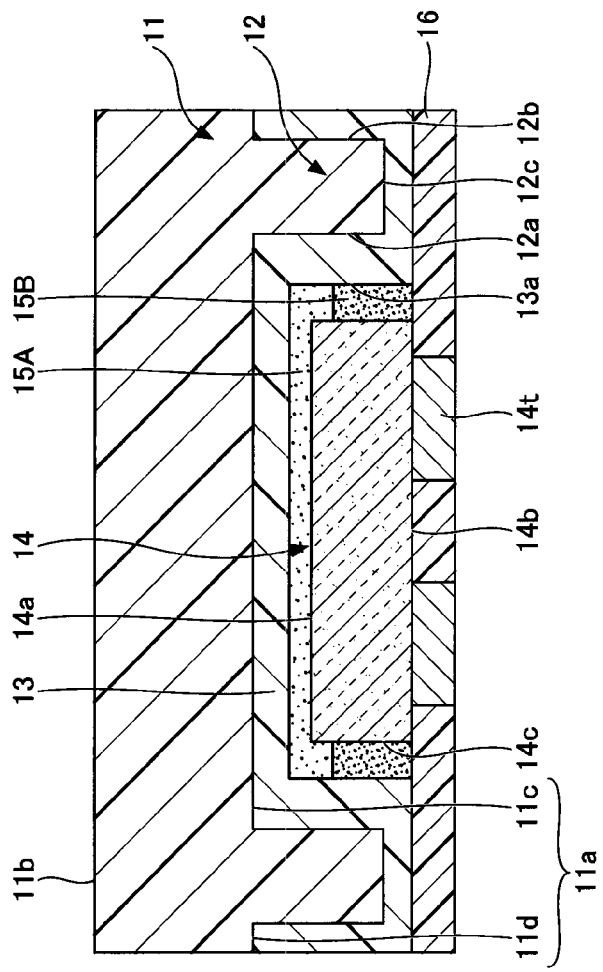
FIG. 26 is a cross-sectional view illustrating a light emitting device related to Variation 6 of the first embodiment.

FIG. 26 is a cross-sectional view of a light emitting device related to Variation 6 of the first embodiment. As shown in FIG. 26, the light emitting device 10F primarily differs from the light emitting device 10 (see FIG. 1) such that the adhesive member 15 is replaced with two adhesive members (a first adhesive member 15A and a second adhesive member 15B). In FIG. 26, the adhesive member has a double layer structure composed of a first adhesive member 15A and a second adhesive member 15B.

The first adhesive member 15A covers the emission face 14a of the light emitting element 14 and extends onto the upper portions of the lateral faces 14c of the light emitting element 14. The second adhesive member 15B covers the lower portions of the lateral faces 14c of the light emitting element 14.

To dispose a first adhesive member 15A and a second adhesive member 15B, for example, in the process shown in FIG. 10, the inside of the phosphor frames 12 are coated with a small amount of the first adhesive member 15A, and the light emitting elements 14 are placed in the phosphor frames 12 to allow the first adhesive member 15 to cover the emission faces 14a and portions of the lateral faces 14c of the light emitting elements 14. When the first adhesive member 15A is hardened, the emission faces 14a and the portions of the lateral faces 14c of the light emitting elements 14 are adhered to the surrounding light transmissive member 13 via the first adhesive member 15A. Subsequently, the second adhesive member 15B is poured into the gaps between the lateral faces 14c of the light emitting elements 14 and the light transmissive member 13, and hardened to adhere the lateral faces 14c of the light emitting elements 14 to the surrounding light transmissive member 13 via the second adhesive member 15B.

In the case of using a single adhesive member 15 to adhere a light emitting element 14, if the amount of the adhesive member 15 is excessive, a greater force to push down the light emitting element 14 would be required. Furthermore, there is a concern for the adhesive member 15 to overflow. Adhering the light emitting element in two steps by using the first adhesive member 15A and the second adhesive member 15B can solve these problems.

The material for the first adhesive member 15A may be the same as or different from the material for the second adhesive member 15B. When the materials for the first and second adhesive members 15A and 15B are different, for example, a light reflecting adhesive may be used for the first adhesive member 15A and a light transmissive adhesive for the second adhesive member 15B. This can reduce the light advancing upwards from the light emitting element 14 to thereby increase light extraction from the lateral side.

Second Embodiment

In a second embodiment, an example of a light emitting device that differs in terms of the structure and the manufacturing method from the first embodiment will be explained. In the second embodiment, the explanation might be omitted for the same constituent elements as those in the embodiments already described.

Light Emitting Device 10G

Figure 27:
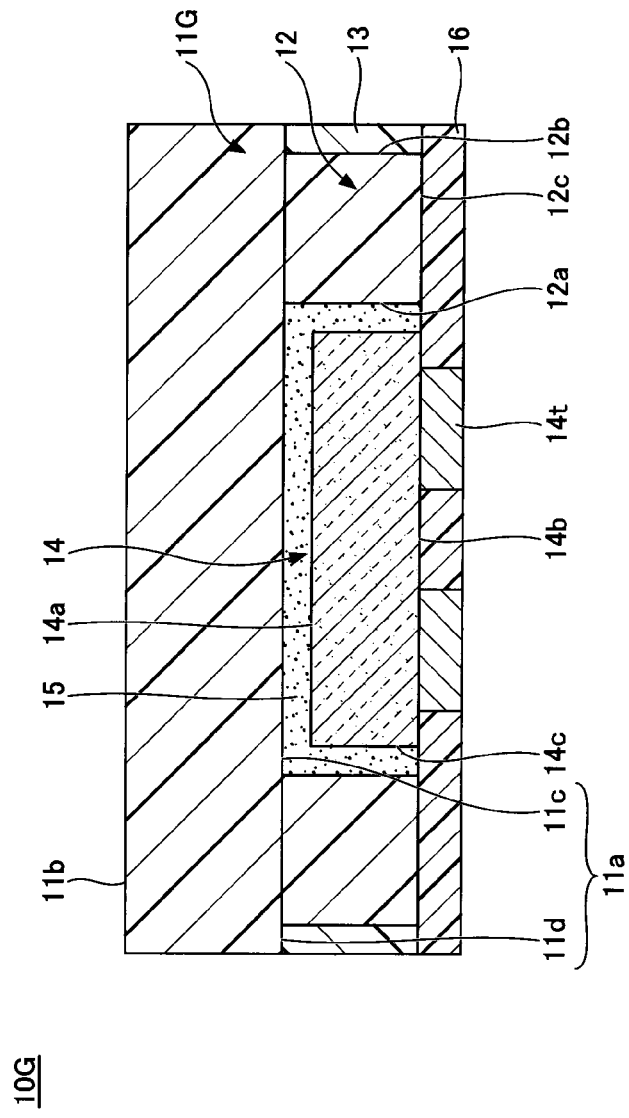
FIG. 27 is a cross-sectional view illustrating a light emitting device related to a second embodiment.
Figure 28:
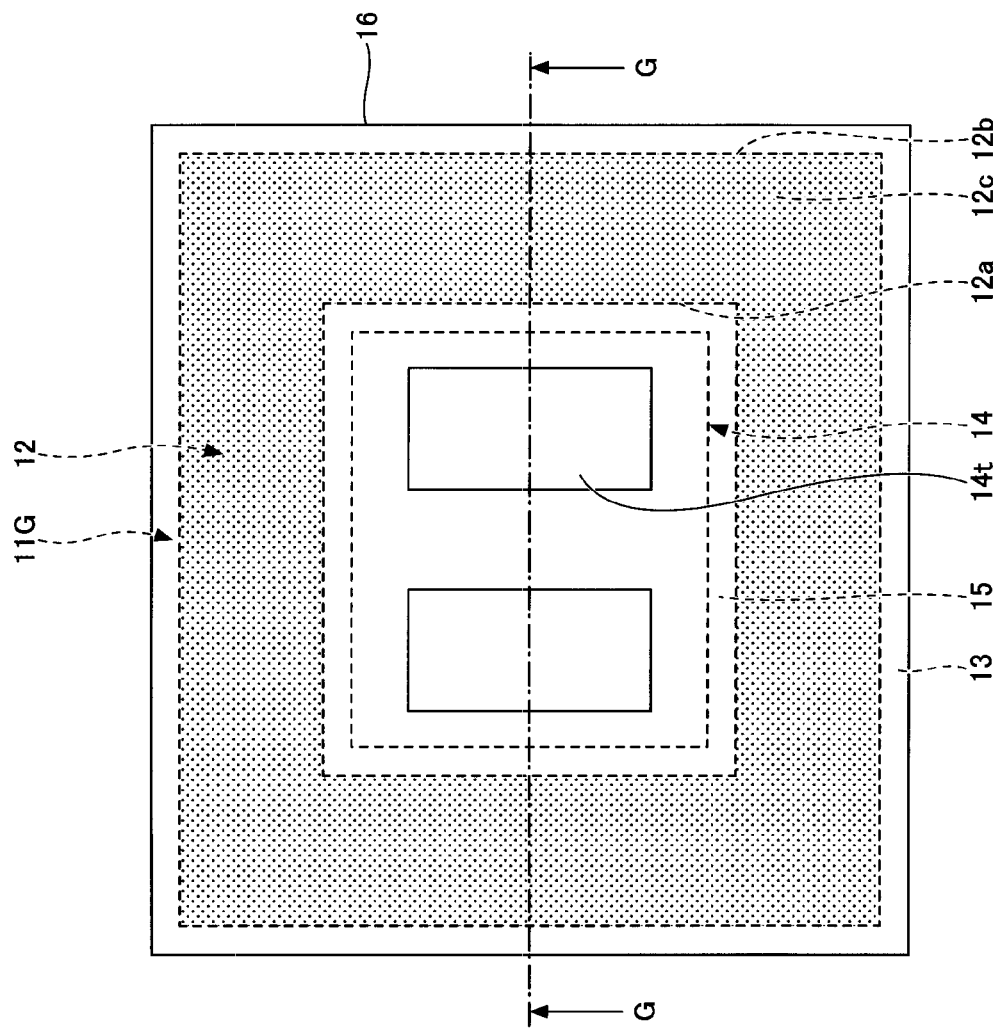
FIG. 28 is a bottom (lower face) view of the light emitting device related to the second embodiment.

FIG. 27 is a cross-sectional view of a light emitting device related to the second embodiment. FIG. 28 is a bottom (lower face) view of the light emitting device related to the second embodiment. FIG. 27 is a cross section taken along line G-G in FIG. 28.

As shown in FIG. 27 and FIG. 28, the light emitting device 10G primarily differs from the light emitting device 10 (see FIG. 1) such that the base 11G is a separate part from the phosphor frame 12.

In the light emitting device 10G, the phosphor frame 12 is adhered to the first principal face 11a of the base 11G. The base 11G and the phosphor frame 12 can be adhered directly or via an adhesive layer. The base 11G, for example, is a sheet shaped member in which the shapes of the first principal face 11a and the second principal face 11b are quadrangular, such as a square or rectangle. The base 11G includes at least one of a phosphor layer, a light transmissive layer, and a light reflecting layer. In the case in which the base 11G is a phosphor layer, the material for the base 11G may be the same as or different from the material for the phosphor frame 12.

Similar to the light emitting device 10 or the like, the phosphor frame 12 is positioned inward of the end part 11d of the first principal face 11a of the base 11G. Similar to the light emitting device 10 or the like, when only the base 11G and the phosphor frame 12 are viewed from the bottom, the phosphor frame 12 is picture frame (quadrangle ring) or ring shaped, for example. The light transmissive member 13 does not have to entirely cover the outer lateral faces 12b of the phosphor frame 12, and can cover only the outer lateral faces 12b at the end part 11d side.

In the example shown in FIG. 27 and FIG. 28, the light transmissive member 13 is disposed to cover only the end part 11d of the first principal face 11a of the base 11G and the outer lateral faces 12b of the phosphor frame 12. The light transmissive member 13 may further cover the central part 11c of the base 11G, the inner lateral faces 12a and the end face 12c of the phosphor frame 12 similar to the light emitting device 10 shown in FIG. 1. Alternatively, the light transmissive member 13 may further cover the central part 11c of the base 11G and the inner lateral faces 12a of the phosphor frame 12 similar to the light emitting device 10C shown in FIG. 23.

Method of Manufacturing Light Emitting Device 10G

FIG. 29 to FIG. 35 are schematic diagrams each showing a state in a manufacturing process for a light emitting device related to the second embodiment. FIG. 32 to FIG. 35 are cross-sectional views taken along line H-H in FIG. 31.

As shown in FIG. 29 to FIG. 32, a first member 110G is provided which has a base 11G, a plurality of phosphor frames 12 positioned on the base 11G, and a light transmissive member 13 disposed between adjacent phosphor frames 12.

Figure 29:
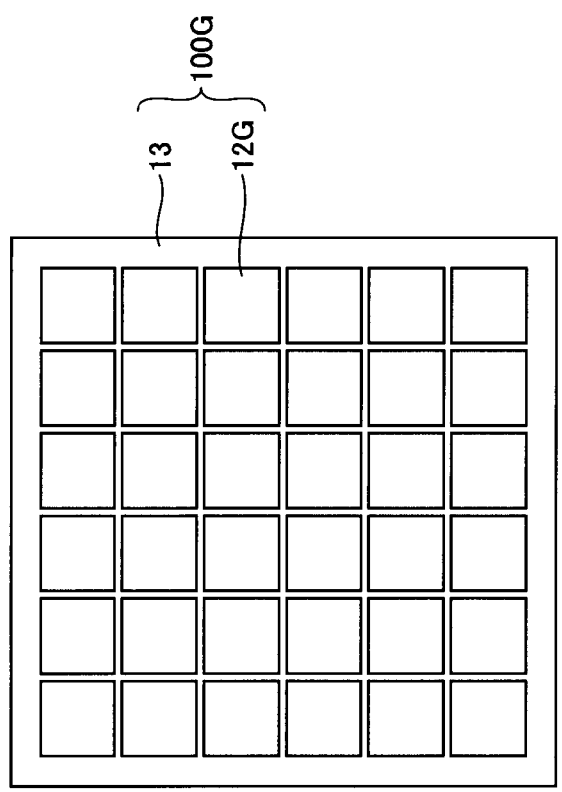
FIG. 29 is a schematic diagram (part 1) showing a state in a light emitting device manufacturing process related to the second embodiment.

Specifically, as shown in FIG. 29, a composite member 100G including quadrangular phosphor layers 12G and a light transmissive member 13 is provided. The phosphor layers 12G are arranged laterally and vertically at predetermined intervals. The light transmissive member 13 is in contact with the lateral faces of the phosphor layers 12G. The light transmissive member 13 is disposed to fill the spaces between the lateral faces of adjacent phosphor layers 12G as well as covering the lateral faces of the phosphor layers 12G arranged in the outermost rows and columns. The phosphor layers 12G and the light transmissive member 13 have the same thickness.

Figure 30:
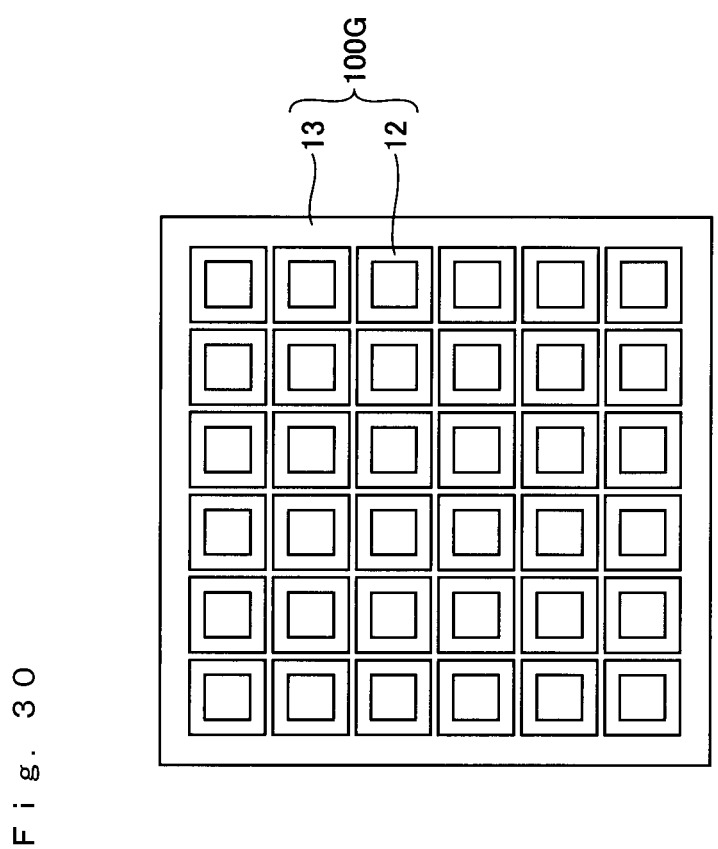
FIG. 30 is a schematic diagram (part 2) showing a state in the light emitting device manufacturing process related to the second embodiment.

Subsequently, as shown in FIG. 30, phosphor frames 12 are provided by creating a quadrangular opening through each phosphor layer 12G. This forms the composite member 100G in which a light transmissive member 13 is disposed on the outer lateral faces of the phosphor frames 12. The quadrangular openings can be created, for example, by pressing. The planar shape of each phosphor layer 12G may be circular, and in that case a circular opening is formed to produce a ring shaped phosphor frame 12.

Figure 31:
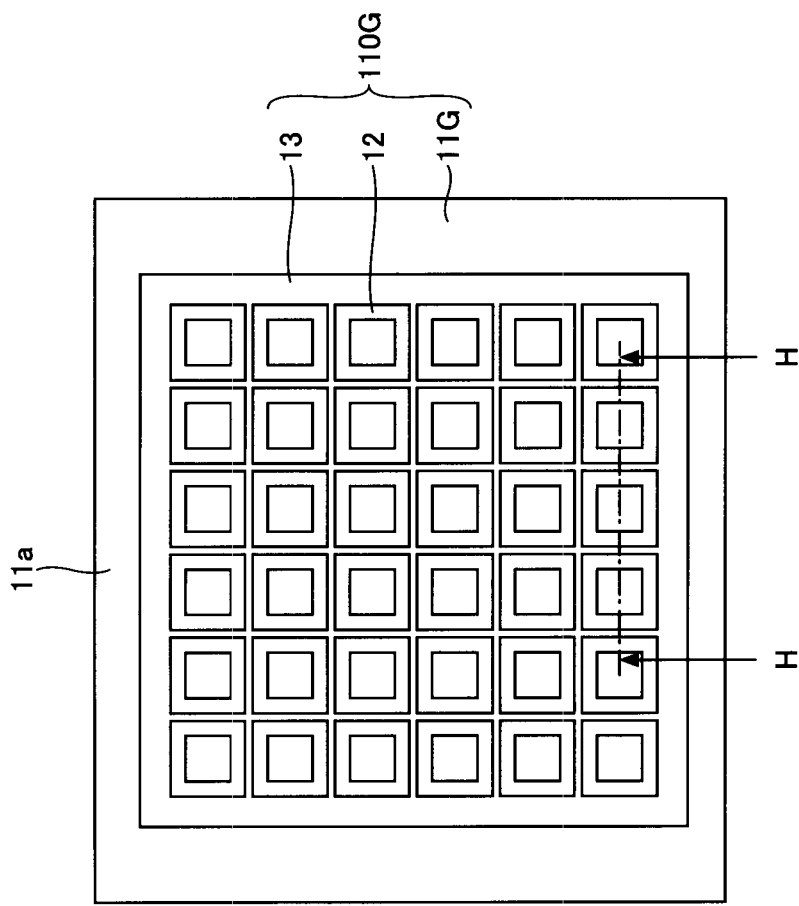
FIG. 31 is a schematic diagram (part 3) showing a state in the light emitting device manufacturing process related to the second embodiment.
Figure 32:
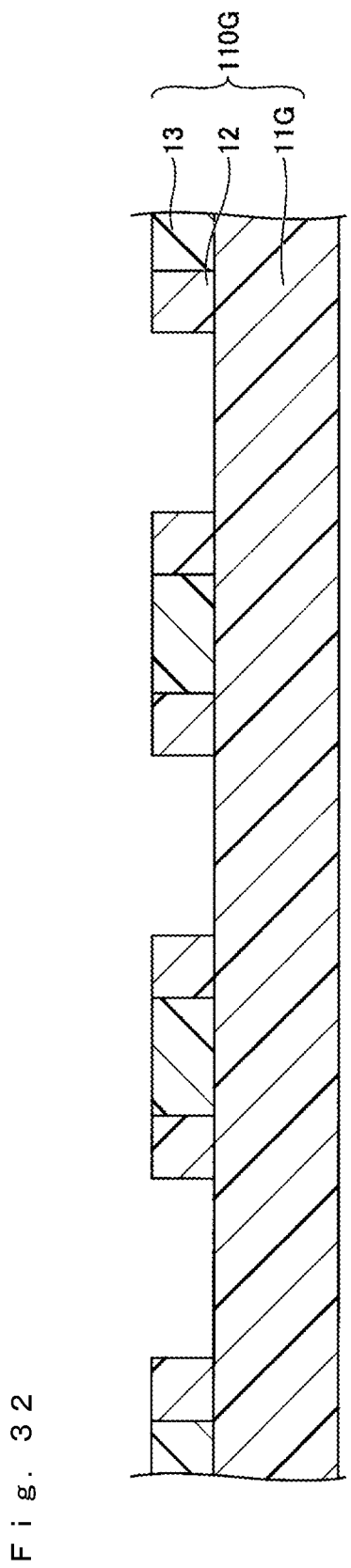
FIG. 32 is a schematic diagram (part 4) showing a state in the light emitting device manufacturing process related to the second embodiment.

Subsequently, as shown in FIG. 31, a sheet shaped base 11G larger than the composite member 100G is provided, and the composite member 100G and the first principal face 11a of the base 11G are adhered together to obtain a first member 110G. The cross-sectional shape of the first member 110G looks like what is shown in FIG. 32. In other words, the phosphor frames 12 are arranged vertically and laterally at predetermined intervals on the first principal face 11a of the base 11G, and the light transmissive member 13 is disposed between the outer lateral faces of adjacent phosphor frames 12. The composite member 100G and the base 11G may be adhered directly or indirectly via an adhesive.

Figure 33:
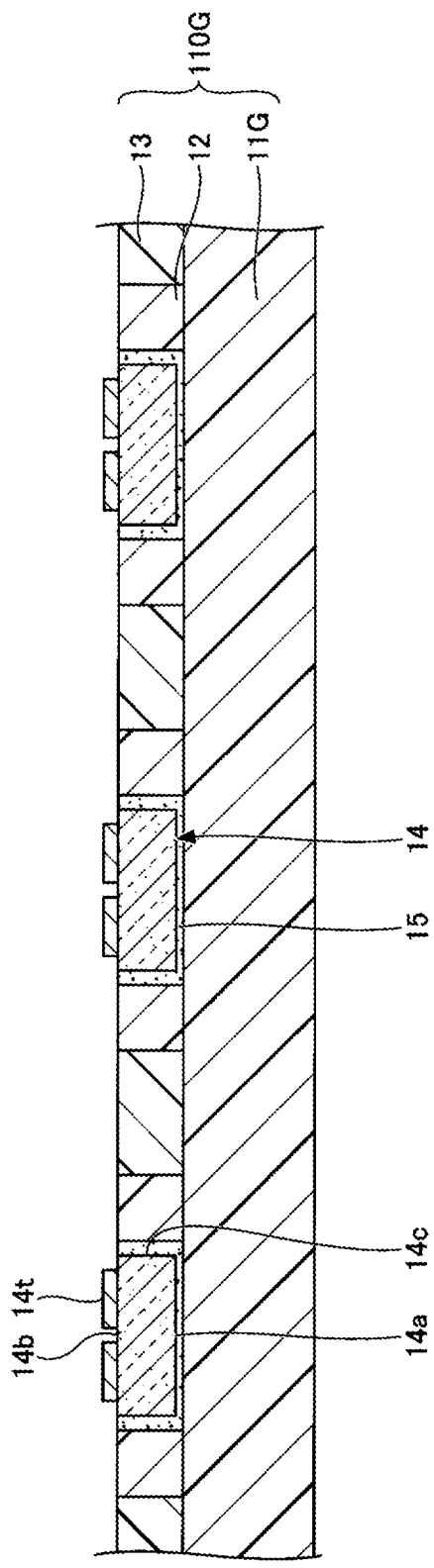
FIG. 33 is a schematic diagram (part 5) showing a state in the light emitting device manufacturing process related to the second embodiment.

Subsequently, as shown in FIG. 33, as many light emitting elements 14 as the phosphor frames 12 are provided, each having an emission face 14a, an electrode forming face 14b opposing the emission face 14a, and lateral faces 14c. Then the light emitting elements 14 are disposed in the phosphor frames 12 so as to face the emission faces 14a to the base 11G. Each light emitting element 14, for example, is disposed in a phosphor frame 12 via an adhesive member 15 applied in the phosphor frame 12. The adhesive member 15 can be applied by, for example, a potting process using a liquid material. Hardening the adhesive member 15 can adhere the emission face 14a and lateral faces 14c of each light emitting element 14 to the first principal face 11a of the base 11G in the phosphor frames 12 and the inner lateral faces of each phosphor frame 12. The light emitting elements 14 are preferably disposed so as to allow the electrodes 14t to protrude from the end faces 12c of the phosphor frames 12.

Figure 34:
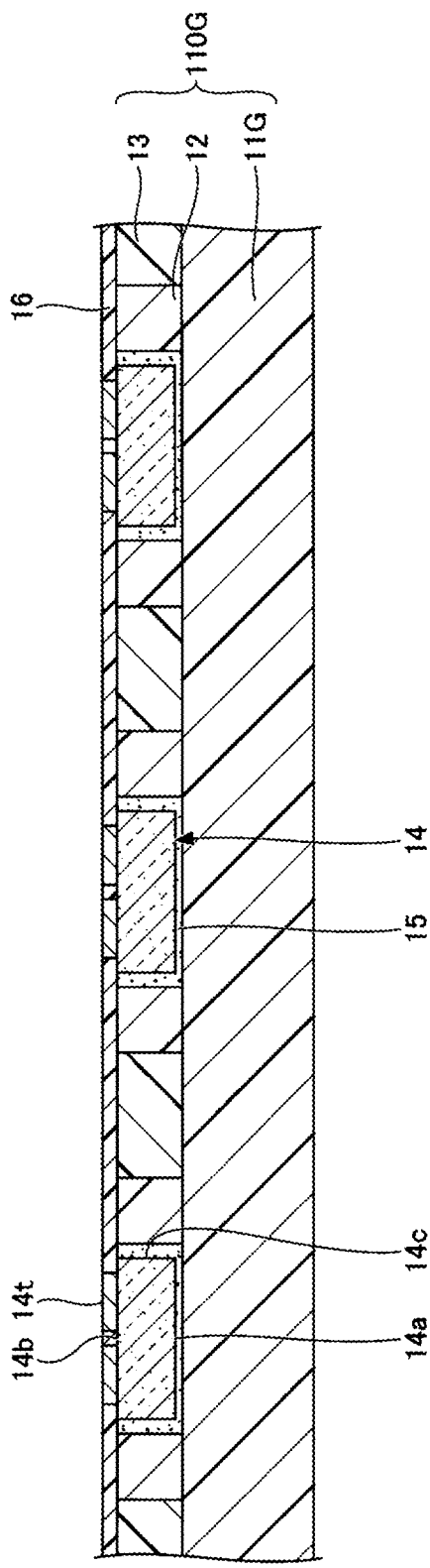
FIG. 34 is a schematic diagram (part 6) showing a state in the light emitting device manufacturing process related to the second embodiment.

Subsequently, as shown in FIG. 34, a light reflecting member 16 is disposed on the electrode forming face 14b side of the light emitting elements 14. Specifically, the light reflecting member 16 is disposed to cover the upper face of the light transmissive member 13, the electrode forming faces 14b of the light emitting elements 14, and the lateral faces of the electrodes 14t of the light emitting elements 14 while the end faces of the electrodes 14t of the light emitting elements 14 are exposed. The light reflecting member 16 may be disposed on the electrode forming face 14b side of the light emitting elements 14 to embed the electrodes 14t on the electrode forming faces 14b, followed by partially removing the light reflecting member until the end faces of the electrodes 14t is exposed. The light reflecting member 16 can be formed by, for example, compression forming using a die, potting, coating, or the like. For example, mechanical polishing using a grinder, sand blasting, or the like can be employed to partially remove the light reflecting member 16 on the electrodes 14t.

Figure 35:
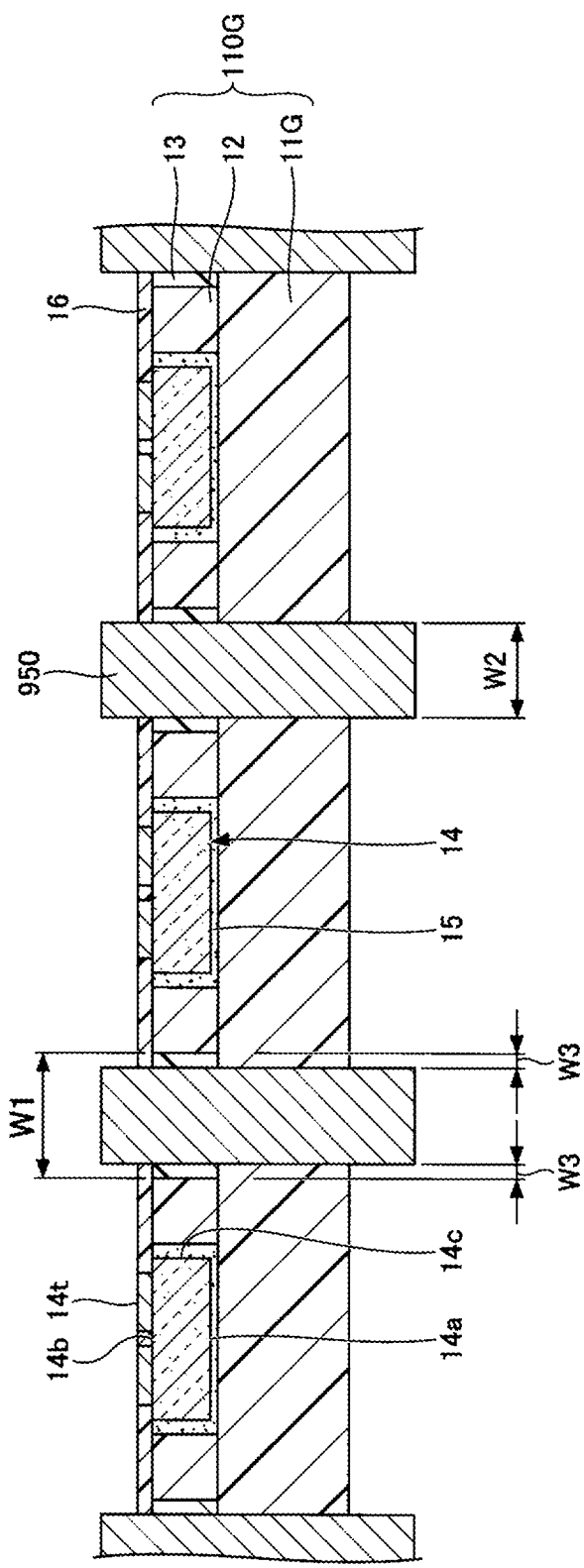
FIG. 35 is a schematic diagram (part 7) showing a state in the light emitting device manufacturing process related to the second embodiment.

Subsequently, as shown in FIG. 35, the base 11G, the light transmissive member 13, and the light reflecting member 16 located between adjacent phosphor frames 12 are cut to obtain the light emitting devices 10G shown in FIG. 27 and FIG. 28. The cutting is performed so as to retain the light transmissive member 13 that covers the outer lateral faces 12b of each phosphor frame 12. In other words, the phosphor frames 12 are not cut, but the light transmissive member 13 covering the outer lateral faces 12b of the phosphor frames 12 is invariably cut. The base 11G, the light transmissive member 13, and the light reflecting member 16 located between adjacent phosphor frames 12 can be cut by a single cutting operation, for example, using a blade 950 having a predetermined width as shown in FIG. 35, but may be cut in two cutting operations by using a blade 960 having a narrower width than that of the blade 950 similar to in FIG. 13.

Third Embodiment

In a third embodiment, an example of a light emitting device having the same structure as, but made by a different manufacturing method from the first embodiment will be explained. In the third embodiment, the explanation might be omitted for the same constituent elements as those in the embodiments already described.

Figure 36:
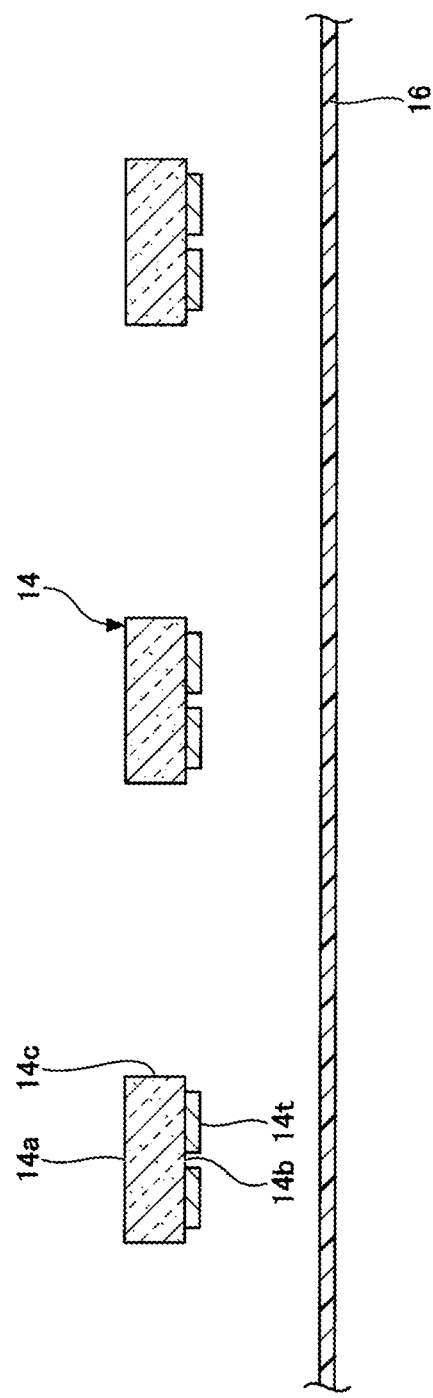
FIG. 36 is a schematic diagram (part 1) showing a state in a light emitting device manufacturing process related to a third embodiment.

FIG. 36 to FIG. 40 are schematic diagrams each showing a state in the light emitting device manufacturing process related to the third embodiment. First, as shown in FIG. 36, an uncured light reflecting member 16 is provided. In addition, light emitting elements 14 each having an emission face 14a, an electrode forming face 14b opposing the emission face 14a, and lateral faces 14c are provided.

Figure 37:
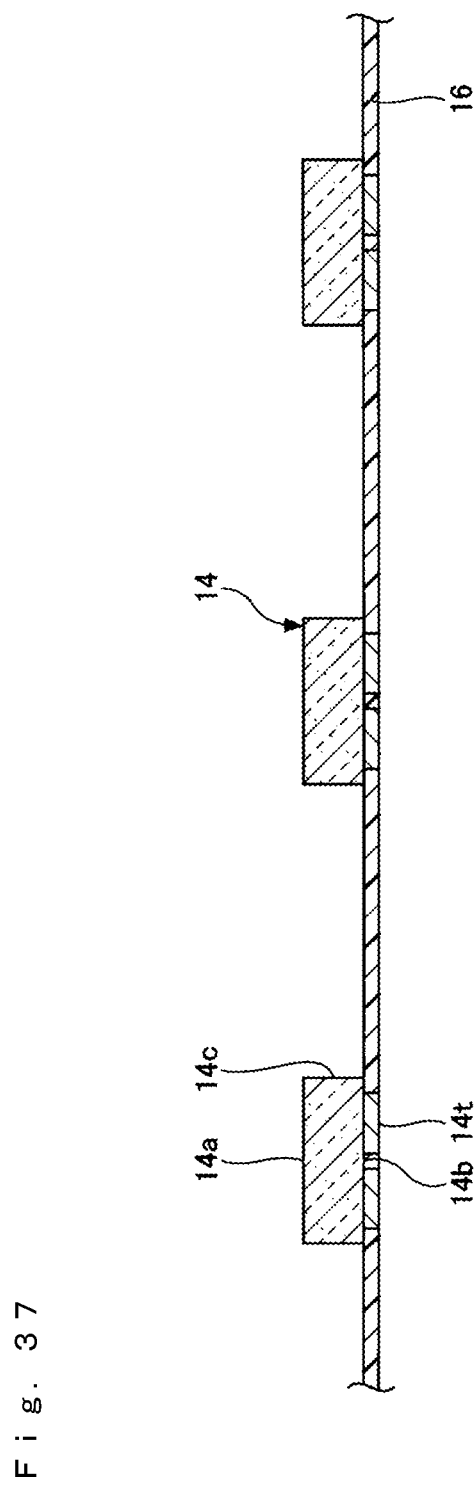
FIG. 37 is a schematic diagram (part 2) showing a state in the light emitting device manufacturing process related to the third embodiment.

Subsequently, as shown in FIG. 37, the light emitting elements 14 are arranged vertically and laterally at predetermined intervals while facing the electrode forming faces 14b to the light reflecting member 16, and pressed down to embed the electrodes 14t in the light reflecting member 16. In other words, the light reflecting member 16 is disposed on the electrode forming faces 14b of the light emitting elements 14. The light reflecting member 16 is subsequently hardened.

Figure 38:
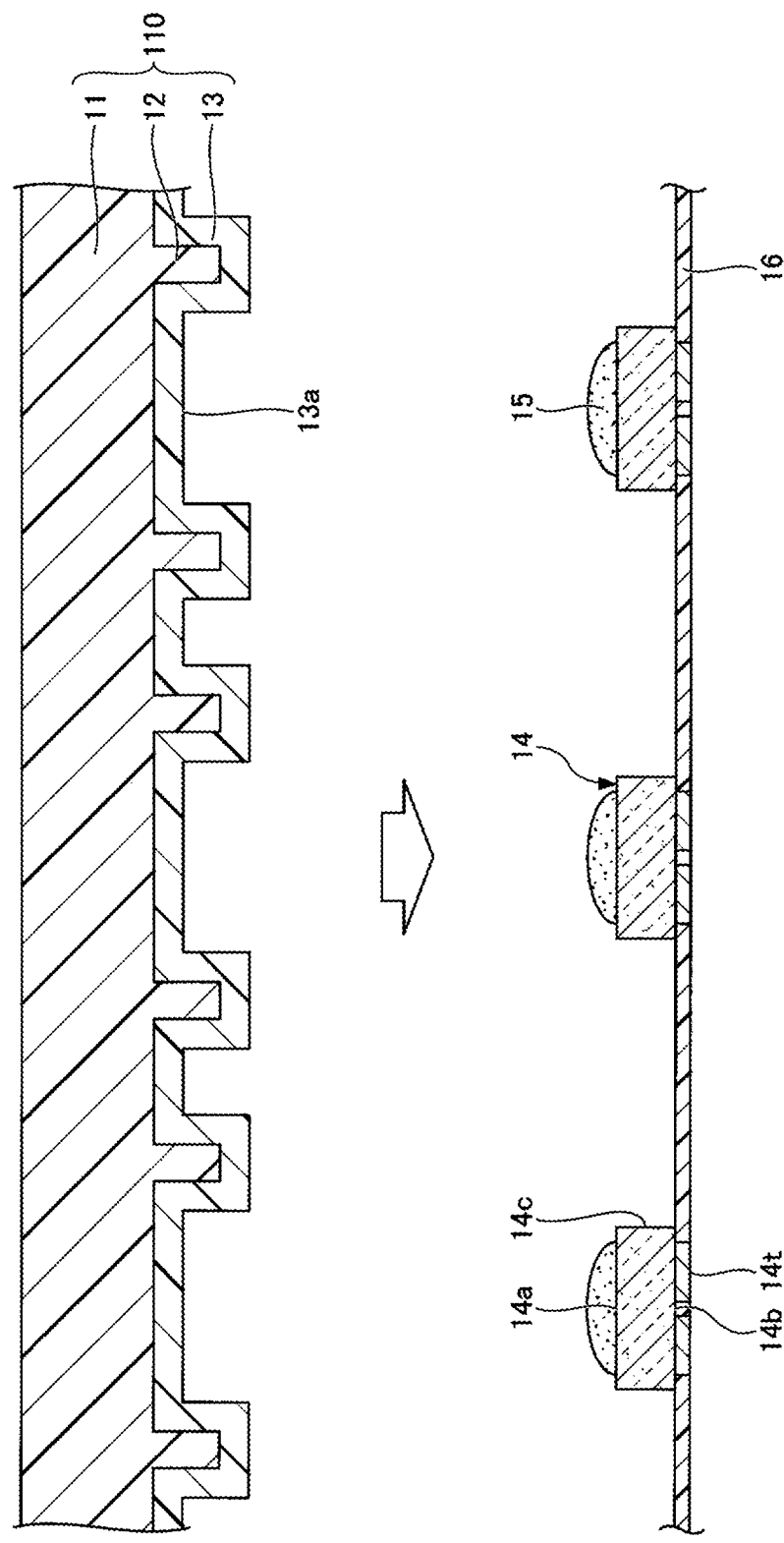
FIG. 38 is a schematic diagram (part 3) showing a state in the light emitting device manufacturing process related to the third embodiment.

Subsequently, as shown in FIG. 38, a first member 110 having a base 11, a plurality of phosphor frames 12 positioned on the base 11, and a light transmissive member 13 disposed between adjacent phosphor frames 12 is provided. After applying an adhesive member 15 on each of the emission faces 14a of the light emitting elements 14, the light transmissive member 13 of the first member 110 is allowed to face the light emitting elements 14 to align the recesses 13a with the light emitting elements 14. The method of providing the first member 110 is as explained with reference to FIG. 3 to FIG. 9.

Figure 39:
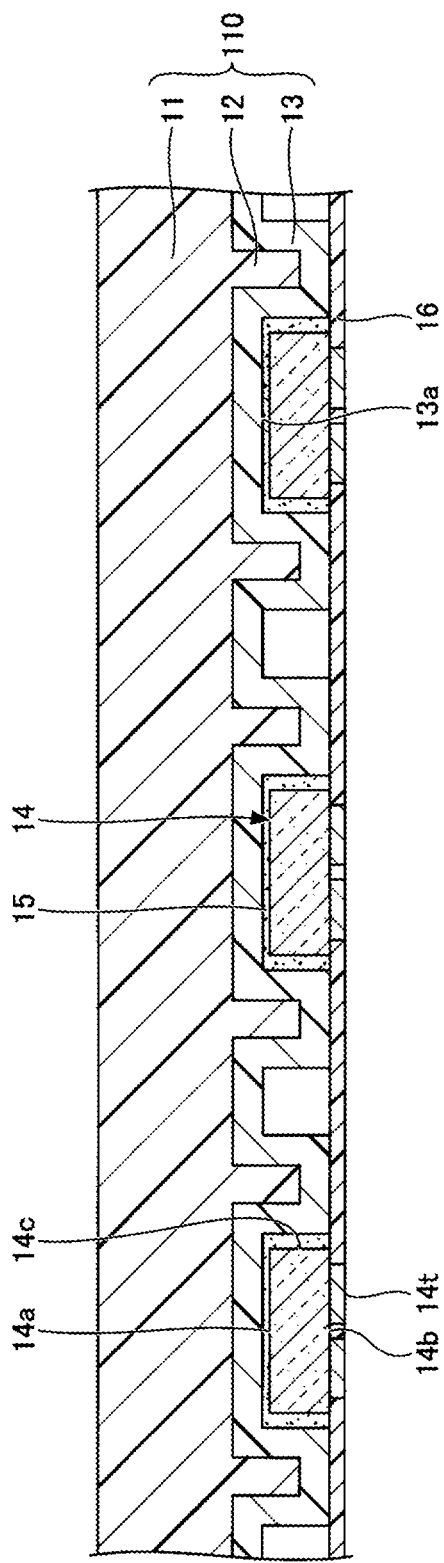
FIG. 39 is a schematic diagram (part 4) showing a state in the light emitting device manufacturing process related to the third embodiment.

Subsequently, as shown in FIG. 39, the first member 110 is placed on the light reflecting member 16 such that the light emitting elements 14 are positioned in the phosphor frames 12 with the emission faces 14a facing the base 11. Then the first member 110 is pressed against the light reflecting member 16, and the adhesive member 15 is hardened to individually fix the light emitting elements 14 in the recesses 13a via the adhesive member 15.

Figure 40:
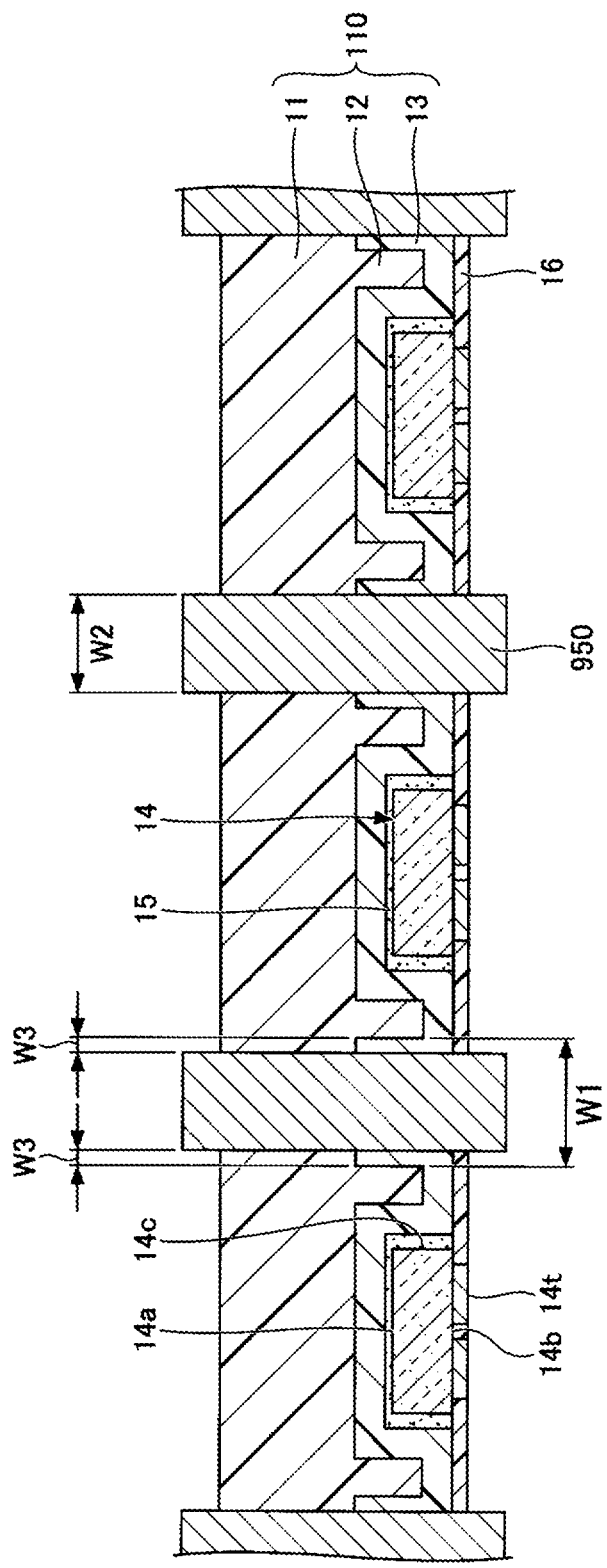
FIG. 40 is a schematic diagram (part 5) showing a state in the light emitting device manufacturing process related to the third embodiment.

Subsequently, as shown in FIG. 40, the base 11, the light transmissive member 13, and the light reflecting member 16 located between adjacent phosphor frames 12 are cut to obtain the light emitting device 10 shown in FIG. 1 and FIG. 2. The cutting is performed so as to retain the light transmissive member 13 that covers the outer lateral faces 12b of each phosphor frame 12. In other words, the phosphor frames 12 are not cut, but the light transmissive member 13 located between the outer lateral faces 12b of adjacent phosphor frames 12 is invariably cut. The base 11, the light transmissive member 13, and the light reflecting member 16 located between adjacent phosphor frames 12 can be cut by a single cutting operation, for example, using a blade 950 having a predetermined width as shown in FIG. 40, but may be cut in two cutting operations by using a blade 960 having a narrower width than that of the blade 950 similar to that shown in FIG. 13.

Fourth Embodiment

In a fourth embodiment, an example of a planar light source in which a plurality of light emitting devices are arranged will be explained. In the fourth embodiment, the explanation might be omitted for the same constituent elements as those in the embodiments already described.

Figure 41:
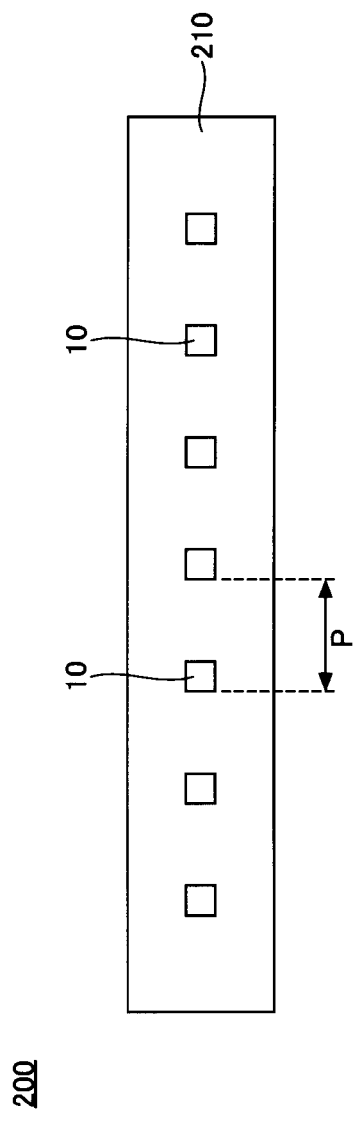
FIG. 41 is a schematic top view (part 1) illustrating a planar light source related to a fourth embodiment.
Figure 42:
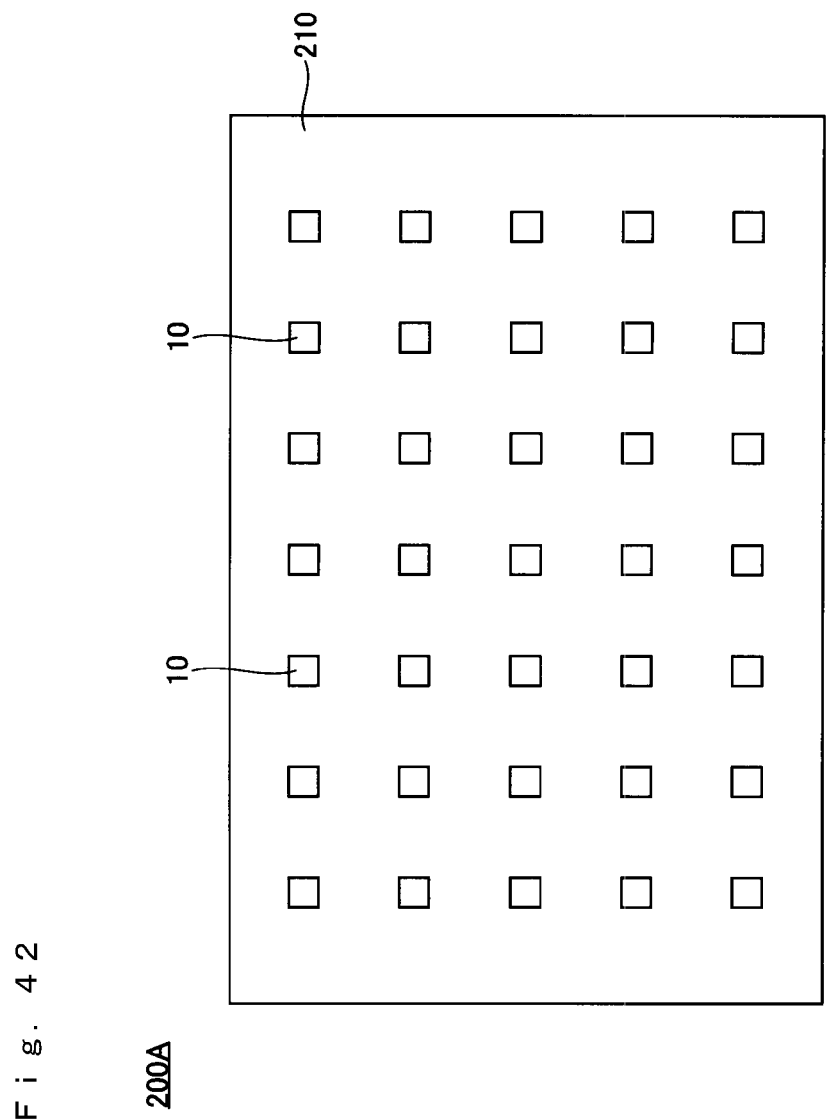
FIG. 42 is a schematic top view (part 2) illustrating a planar light source related to the fourth embodiment.

FIG. 41 is a schematic top view (part 1) of a planar light source related to the fourth embodiment. FIG. 42 is a schematic top view (part 2) of a planar light source related to the fourth embodiment. The planar light source 200 shown in FIG. 41 has a plurality of light emitting devices 10 arranged in a row on a wiring substrate 210. The planar light source 200A shown in FIG. 42 has a plurality of light emitting devices 10 arranged in a matrix on a wiring substrate 210.

In the planar light sources 200 and 200A, the light emitting devices 10 are preferably arranged using the same pitch (P in FIG. 41), but the pitch may vary. The pitch of the light emitting devices 10 can be suitably adjusted depending on the size and the luminance of the light emitting devices. The pitch of the light emitting devices 10 is, for example, in the 5 mm to 100 mm range, preferably in the 8 mm to 50 mm range.

Figure 43:
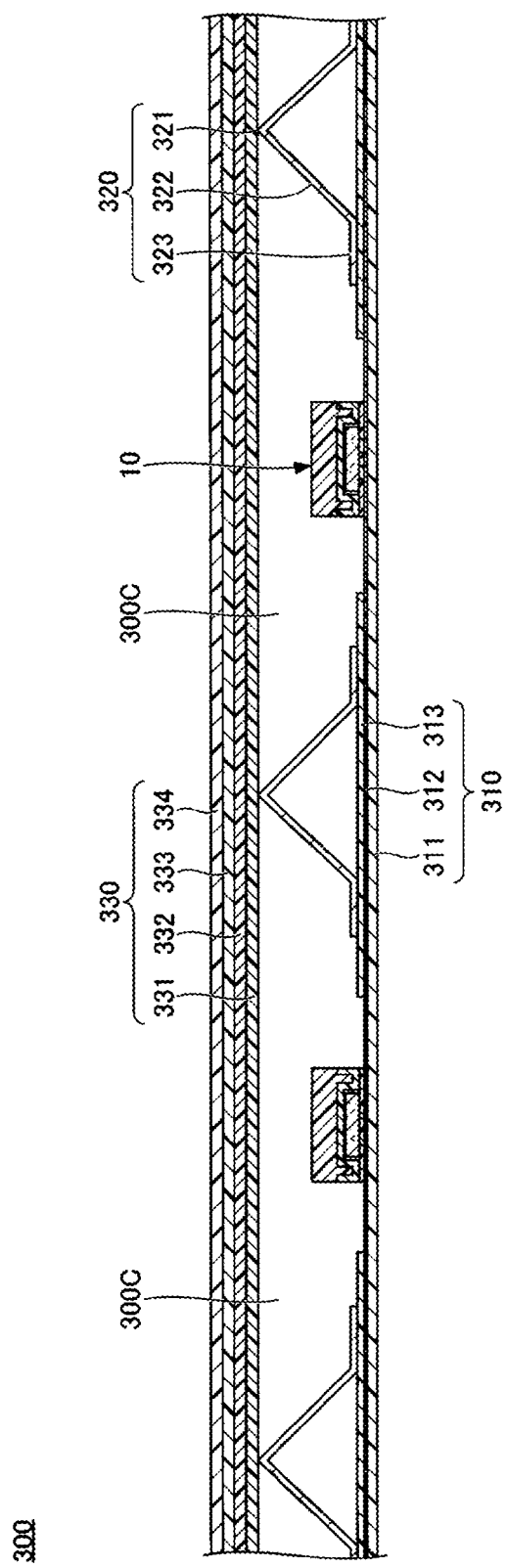
FIG. 43 is a partial cross-sectional view (part 1) of a specific example of a planar light source having a plurality of light emitting devices arranged in a matrix on a wiring substrate.

Specific examples of planar light sources will be explained below with reference to FIG. 43 to FIG. 46. FIG. 43 is a partial cross-sectional view (part 1) of a specific example of a planar light source having a plurality of light emitting devices arranged in a matrix on a wiring substrate.

The planar light source 300 shown in FIG. 43 includes light emitting devices 10, a wiring substrate 310, and a sectioning member 320. In place of the light emitting devices 10, any of the light emitting devices 10A to 10G may be used. The wiring substrate 310 has an insulation base 311 and wiring 312 disposed on the base 311. It may further include an insulation resin 313 partly covering the wiring 312 as needed.

The sectioning member 320 is provided on the same side of the wiring substrate 310 on which the light emitting devices 10 are disposed. The sectioning member 320 includes apexes 321 arranged in a lattice in a top view, wall parts 322 for individually surrounding light emitting devices 10, and a bottom part 323 connected to the lower ends of the wall parts in a top view, creating a plurality of spaces individually surrounding light emitting devices 10. The wall parts 322 of the sectioning member 320, for example, extend from the apexes 321 to the wiring substrate 310, and in a cross section, the width of each space surrounded by the wall parts 322 becomes smaller towards the wiring substrate 310. The light emitting devices 10 are disposed in the through holes created approximately in the center of the bottom part 323 in each space. The sectioning member 320 preferably is a light reflecting member.

Each space (or region) surrounded by the wall parts 322 is defined as one section 300C, and the sectioning member 320 defines a plurality of sections 300C. In this embodiment, one light emitting device 10 is disposed per section 300C. However, two or more light emitting devices 10 may be disposed per section 300C. In this case, for example, three light emitting devices 10, i.e., red, green, and blue light emitting devices, may be disposed per section 300C. Alternatively, two light emitting devices 10, i.e., warm white and neutral white light emitting devices, may be disposed per section 300C.

As described above, disposing such a sectioning member 320 having the wall parts 322 and the bottom part 323 individually surrounding the light emitting devices 10 on the wiring substrate 310 allows the light from the light emitting devices 10 to be reflected on the wall parts 322 and the bottom part 323, thereby increasing the light extraction efficiency. This can reduce the luminance nonuniformity in each section 300C as well as in units of sections 300C.

The planar light source 300 may include an optical member 330 above the apexes 321 of the sectioning member 320. The optical member 330 can include at least one selected from the group consisting of a light diffusion sheet 331, prism sheets (a first prism sheet 332 and second prism sheet 333), and a polarizing sheet 334. The light uniformity of the planar light source 300 can be improved by including an optical member 330.

The planar light source 300, together with an optical member 330 disposed above the apexes 321 of the sectioning member 320 and a liquid crystal panel disposed thereon, can be used as a direct-lit backlight light source. The stacking order of the members of the optical member 330 can be set as desired. The optical member 330 does not have to be in contact with the apexes 321 of the sectioning member 320.

Light Diffusion Sheet 331

A light diffusion sheet 331 is disposed above light emitting devices 10 in contact with the apexes 321 of the sectioning member 320. The light diffusion sheet 331 is preferably a flat sheet shaped member, but may have protrusions and depressions provided on the surface. The light diffusion sheet 331 is preferably disposed substantially in parallel with the wiring substrate 310.

The light diffusion sheet 331 can be composed of a material that is less likely to absorb visible light, for example, a polycarbonate resin, polystyrene resin, acrylic resin, polyethylene resin, or the like. In order to diffuse the incident light, depressions and protrusions may be created on the surface of the light diffusion sheet 331 or a material having a different refractive index is dispersed in the light diffusion sheet 331. The depressions and protrusions can be in the 0.01 mm to 0.1 mm range in size, for example. For the material having a different refractive index, for example, a polycarbonate resin, acrylic resin, or the like, can be selected and used.

The thickness and the degree of diffusion of the light of the diffusion sheet 331 can be suitably set, and one that is commercially available as a light diffusion sheet, diffuser film, or the like, can be utilized. For example, the thickness of the light diffusion sheet 331 can be set in the 1 mm to 2 mm range.

First Prism Sheet 332 and Second Prism Sheet 333

A first prism sheet 332 and a second prism sheet 333 each have a plurality of prisms arranged in a predetermined direction on the surface. For example, using the two dimensions of the sheet surface extending in the X direction and the Y direction orthogonal to the X direction, the first prism sheet 332 can have a plurality of prisms along the Y direction, and the second prism sheet 333 can have a plurality of prisms along the X direction. The first prism sheet 332 and the second prism sheet 333 can refract the light entering from various directions towards the display panel which faces the planar light source 300. This allows the light exiting the emission face of the planar light source 300 to primarily exit in the direction perpendicular to the upper face, thereby increasing the front view luminance of the planar light source 300.

Polarizing Sheet 334

A polarizing sheet 334, for example, can selectively transmit the light in the polarization direction matching the polarization direction of the polarizing sheet disposed on the backlight side of the display panel, such as a liquid crystal display panel, while reflecting the polarized light in the direction perpendicular to the polarization direction towards the first prism sheet 332 and the second prism sheet 333. A portion of the polarized light returning from the polarizing sheet 334 is reflected again by the first prism sheet 332, the second prism sheet 333, and the light diffusion sheet 331. At this time, the polarization direction changes to be converted into polarized light having the polarization direction of the polarizing sheet of the liquid crystal display panel, for example, to reenter the polarizing sheet 334 to be output towards the display panel. This can align the direction of polarization of the light exiting the planar light source 300 to thereby highly efficiently output the light polarized in the direction effective in increasing the luminance of the display panel. For the polarizing sheet 334, the first prism sheet 332, the second prism sheet 333, and the like, commercially available optical components for use in a backlight can be used.

A planar light source 300 can be produced, for example, by mounting a sectioning member 320 and light emitting devices 10 on a wiring substrate 310, and, as needed, placing an optical member 330 above the sectioning member 320.

Figure 44:
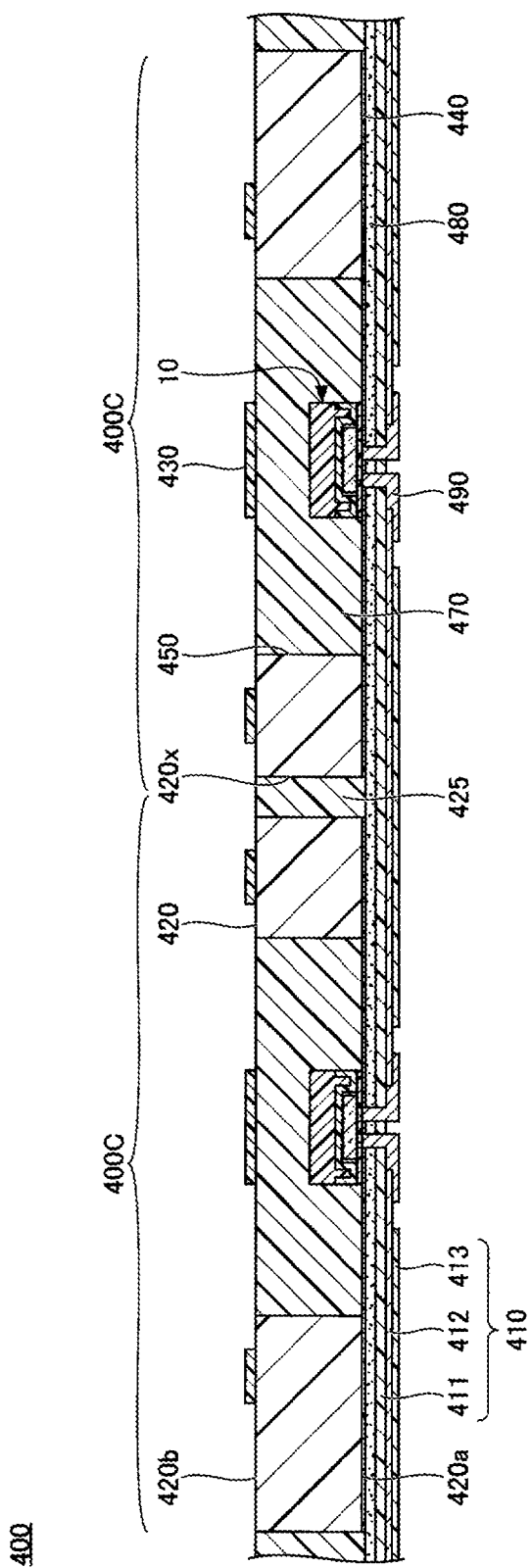
FIG. 44 is a partial cross-sectional view (part 2) of a specific example of a planar light source having a plurality of light emitting devices arranged in a matrix on a wiring substrate.

FIG. 44 is a partial cross-sectional view (part 2) of a specific example of a planar light source including a plurality of light emitting devices arranged in a matrix on a wiring substrate.

The planar light source 400 shown in FIG. 44 has light emitting devices 10, a wiring substrate 410 on which the light emitting devices 10 are disposed, a light guide plate 420 for guiding the light exiting the light emitting devices 10, light reflecting resin members 430 positioned above the light emitting devices 10, and a light reflecting adhesive member 440 positioned under the light emitting devices 10. In place of the light emitting devices 10, any of the light emitting devices 10A to 10G may be used.

The wiring substrate 410 includes an insulation base 411 and wiring 412 disposed on the base 411. It may further include an insulation resin 413 partly covering the wiring 412 as needed. On the upper face of the base 411 of the wiring substrate 410, a light reflecting sheet 480, an adhesive member 440, and a light guide plate 420 are successively stacked. Connection members 490 extend through the base 411 of the wiring substrate 410, the light reflecting sheet 480, and the adhesive member 440 to electrically connect the electrodes of the light emitting devices 10 and the wiring 412.

The light guide plate 420 has a first principal face 420a and a second principal face 420b opposing the first principal face 420a. The first principal face 420a of the light guide plate 420 is in contact with the adhesive member 440. The second principal face 420b side of the light guide 420 is the emission face of the planar light source 400.

In the light guide plate 420, through holes 420x extending through from the first principal face 420a to the second principal face 420b are created. The through holes 420x are created in a matrix in a top view, for example, and the planar light source 400 is sectioned by the matrix patterned through holes 420x into a plurality of two dimensionally arranged emission regions 400C. A resin 425, which is a silicon resin or the like containing a light diffusing material, may be disposed in the through holes 420x. The light guide plate 420 may have a lattice patterned grooves open on the second principal face 420b in place of the through holes 420x extending through from the first principal face 420a to the second principal face 420b.

In each emission region 400C, a through hole 450 having a circular shape in a top view and extending through from the first principal face 420a to the second principal face 420b is provided, and a light emitting device 10 is disposed in the through hole 450. In each through hole 450, a light transmissive member 470 covering the upper face and the lateral faces of the light emitting device 10 is disposed. The upper face of each light transmissive member 470 and the second principal face 420b of the light guide plate 420 are coplanar, for example. On the second principal face 420b, a resin member 430 is disposed at the positions that overlap the light emitting devices 10. Specifically, the resin member 430 is disposed on the light transmissive member 470 covering the light emitting device 10 in each through hole 450. The resin member 430 may be disposed to extend from the area above the light transmissive member 470 onto the second principal face 420b of the light guide plate 420.

A portion of the light exiting the light emitting devices 10 propagates through the light guide plate 420 and enters the resin members 430. The resin members 430, which are formed of a light reflecting material, such as a resin material in which a light reflecting filler is dispersed, can reflect a portion of the light from the light emitting devices 10 towards the first principal face 420a of the light guide plate 420. In other words, the resin members 430 disposed above the light emitting devices 10 can moderately transmit the light exiting the light emitting devices 10 upwards while diffusing the other portion of the light in the downward and lateral directions. This as a result can hinder the areas of the second principal face 420b of the light guide plate 420 immediately above the light emitting devices 10 from having excessively higher luminance than the other area.

The planar light source 400 can be produced, for example, by placing a light guide plate 420 on a wiring substrate 410, disposing light emitting devices 10 in the through holes 450 of the light guide plate 420, disposing light transmissive members 470 in the through holes 450 to cover the light emitting devices 10, and disposing resin members 430 on the light transmissive members 470.

Figure 45:
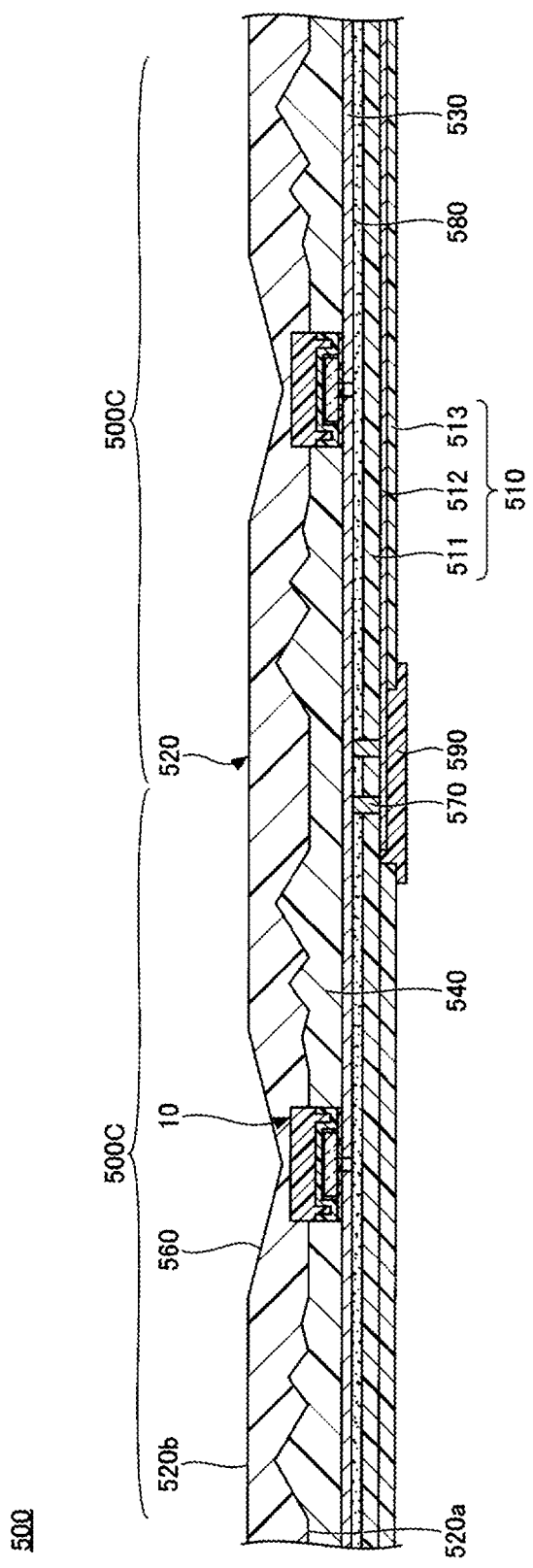
FIG. 45 is a partial cross-sectional view (part 3) of a specific example of a planar light source having a plurality of light emitting devices arranged in a matrix on a wiring substrate.

FIG. 45 is a partial cross-sectional view (part 3) of a specific example of a planar light source having a plurality of light emitting devices arranged in a matrix on a wiring substrate.

The planar light source 500 shown in FIG. 45 includes light emitting devices 10, a wiring substrate 510 on which the light emitting devices 10 are disposed, a light guide plate 520 for guiding the light exiting the light emitting devices 10, and a member 540 having light reflectivity positioned under the light guide plate 520. In place of the light emitting devices 10, any of the light emitting devices 10A to 10G may be used.

The wiring substrate 510 includes an insulation base 511 and wiring 512 disposed on the base 511. It may further include an insulation resin 513 partly covering the wiring 512 as needed. On the upper face of the base 511 of the wiring substrate 510, wiring 530 electrically connected to the electrodes of the light emitting devices 10 is disposed via an adhesive layer 580. Vias 570 penetrate through the adhesive layer 580 and the base 511 of the wiring substrate 510, electrically connecting the wiring 530 and the wiring 512. The areas around the vias 570 are protected by protective members 590.

The light guide plate 520 has a first principal face 520a and a second principal face 520b opposing the first principal face 520a. The first principal face 520a may have protrusions and depressions. The first principal face 520a of the light guide plate 520 is in contact with the member 540. The second principal face 520b side of the light guide plate 520 is the emission face of the planar light source 500. The planar light source 500 is sectioned into a plurality of emission regions 500C.

In the light guide plate 520, a recess 560 open on the second principal face 520b is created in each emission region 500C. Each recess 560 has a shape of an inverted cone, inverted polygonal pyramid, such as an inverted quadrangle pyramid, inverted hexagonal pyramid, and the like, an inverted truncated cone, or an inverted truncated polygonal pyramid. Each recess 560 is positioned to overlap a light emitting device 10 disposed on the wiring substrate 510 in a top view. The center of each recess 560 preferably coincides with the optical axis of a light emitting device 10 in a top view.

The member 540 reflects the light exiting the light emitting devices 10. A single member 540 may be disposed for the entire planar light source 500. In other words, the member 540 may be continuously disposed straddling adjacent emission regions 500C.

A portion of the light emitted from the light emitting devices 10 propagates through the light guide plate 520 and enters the recesses 560. The recesses 560 can reflect the incident light at the interfaces with a material having a different refractive index from that of the light guide plate 520 (e.g., the air) in the lateral direction relative to the light emitting devices 10. In other words, the recesses 560 provided above the light emitting devices 10 can moderately transmit the light exiting the light emitting devices 10 upwards while diffusing a portion of the light in the downward and lateral directions. This as a result can hinder the areas of the second principal face 520b of the light guide plate 520 directly above the light emitting devices 10 from having excessively higher luminance than the other area. A light reflecting member (e.g., a metal reflective film or white resin) may be disposed in the recesses 560.

The planar light source 500 can be produced, for example, by mounting light emitting devices 10 on a light guide plate 520, disposing a member 540 that covers the first principal face 520a of the light guide plate 520, and subsequently adhering the structure to a wiring substrate 510.

Figure 46:
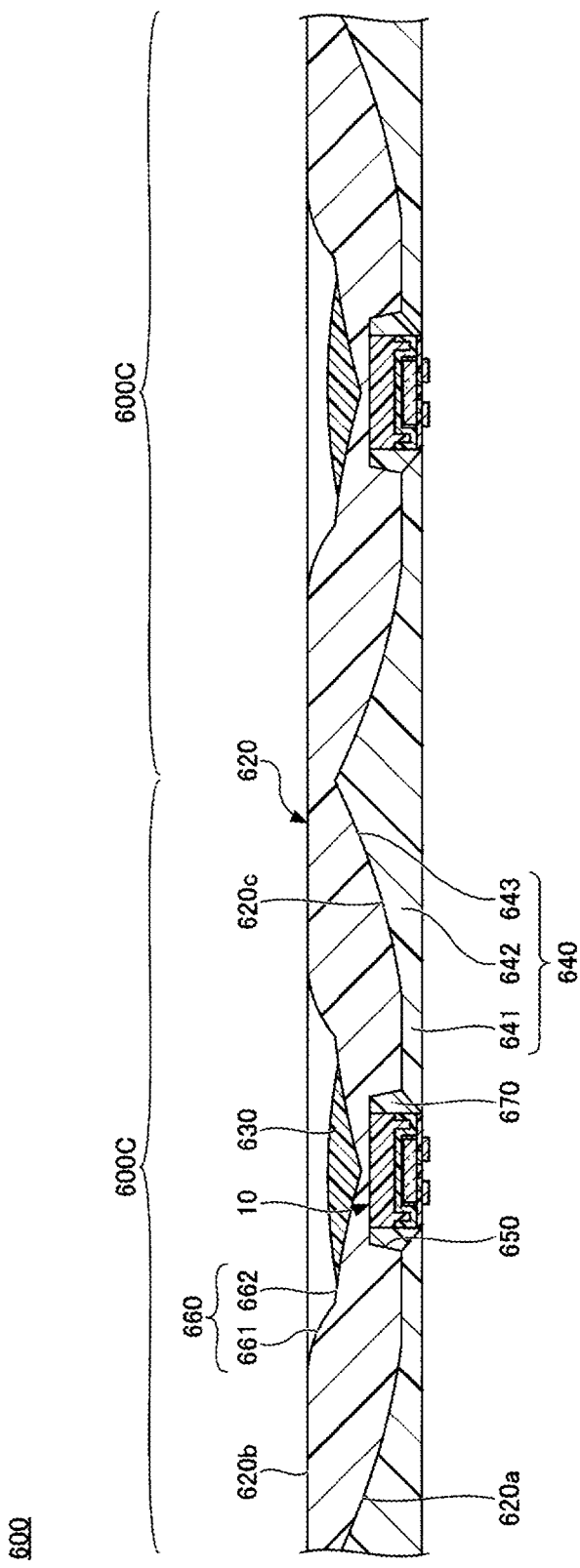
FIG. 46 is a partial cross-sectional view of a specific example of a light emitting module having a plurality of light emitting devices arranged in a matrix.

Planar light sources having a plurality of light emitting devices arranged in a matrix on a wiring substrate have been illustrated in FIG. 43 to FIG. 45. FIG. 46 illustrates a light emitting module including a plurality of light emitting devices arranged in a matrix. In the present disclosure, with respect to a light source including a plurality of light emitting devices arranged in a matrix, one having a wiring substrate is referred to as a planar light source, and one without a wiring substrate is referred to as a light emitting module. By arranging a plurality of light emitting modules in a one-dimensional or two-dimensional array on a single wiring substrate, a planar light source can be produced.

FIG. 46 is a partial cross-sectional view of a specific example of a light emitting module having a plurality of light emitting devices arranged in a matrix.

The light emitting module 600 shown in FIG. 46 has light emitting devices 10, a light guide plate 620 through which the light emitted from the light emitting devices 10 is guided, light reflecting resin members 630 positioned above the light emitting devices 10, and a light reflecting adhesive member 640 positioned under the light emitting devices 10. In place of the light emitting devices 10, any of the light emitting devices 10A to 10G may be used.

The light guide plate 620 has a first principal face 620a and a second principal face 620b opposing the first principal face 620a. The first principal face 620a of the light guide plate 620 is in contact with the adhesive member 640. The second principal face 620b of the light guide plate 620 is the emission face of the light emitting module 600.

The light emitting module 600 is sectioned into a plurality of emission regions 600C. In each emission region 600C of the light guide plate 620, a first recess 650 open on the first principal face 620a and a second recess 660 open on the second principal face 620b are provided. The first recess 650 and the second recess 660 are positioned to overlap in a top view. The first recess 650 and the second recess 660 are preferably positioned such that their centers coincide in a top view. The size of the second recess 660 in a top view may be larger than the size of the first recess 650.

A light emitting device 10 is disposed in each first recess 650 formed on the first principal face 620a of the light guide plate 620. A light transmissive member 670 covering the light emitting device 10 may be disposed in each first recess 650. In the case of disposing a light transmissive member 670 covering the light source in each first recess 650, the adhesive member 640 may cover the light transmissive member 670 in part or whole.

A resin member 630 is disposed in each second recess 660 formed on the second principal face 620b side of the light guide plate 620. Each second recess 660, for example, has an upper recess portion 661 positioned closer to the planar part of the second principal face 620b in a cross section, and a lower recess portion 662 that is positioned closer to the first principal face 620a than the upper recess portion 661 and has a different oblique angle from that of the upper recess portion 661 in a cross section. In this case, the resin member 630 can be disposed in the lower recess portion 662, for example.

The adhesive member 640 reflects the light emitted from the light emitting devices 10. In this embodiment, as an example, the adhesive member 640 includes a base part 641 and a wall part 642 that is disposed around and continuous with the base part 641. The base part 641 is the part located on the planar part of the first principal face 620a of the light guide plate 620 that is around a first recess 650. The wall part 642 is the part located in a depressed part of the light guide plate 620 that is around a planar part.

The wall part 642, for example, rises from the first principal face 620a side to the second principal face 620b side of the light guide plate 620 as becoming farther from the first recess 650. The wall part 642 in a top view has an oblique face 643 that surrounds a light emitting device 10. A single adhesive member 640 may be disposed for the entire light emitting module 600. In other words, the adhesive member 640 may be continuously disposed, straddling adjacent emission regions 600C.

The light guide plate 620 may have a curved face part 620c that is entirely or partly curved in a cross section. The curved face part 620c is provided, for example, from the vicinity of the first recess 650 to the peripheral edge of the first principal face 620a in each emission region 600C. By disposing an adhesive member 640 on the first principal face 620a, the light incident on the first principal face 620a at a small angle can be reflected by the curved face part 620c towards the second principal face 620b to thereby increase the light extraction efficiency.

A portion of the light emitted from each light emitting device 10 propagates through the light guide plate 620 before entering the resin member 630. Each resin member 630 formed of, for example, a light reflecting material such as a resin in which a light reflecting filler is dispersed can reflect a portion of the light emitted from a light emitting device 10 towards the first principal face 620a of the light guide plate 620. In other words, the resin members 630 disposed above the light emitting devices 10 can moderately transmit the light emitted upwards from the light emitting devices 10 while diffusing a portion of the light in the downward and lateral directions. This as a result can hinder areas directly above the light emitting devices 10 in the second principal face 620b of the light guide plate 620 from having excessively higher luminance than the other area.

The light emitting module 600 can be produced, for example, by mounting light emitting devices 10 on a light guide plate 620, disposing an adhesive member 640 that covers the first principal face 620a of the light guide plate 620, and disposing resin members 630 in the second recesses 660 of the second principal face of the light guide plate 620.

Examples of materials for the light guide plate employed in the planar light sources and the light emitting module shown in FIG. 44 to FIG. 46 include thermoplastic resins, such as acrylic, polycarbonate, cyclic polyolefin, polyethylene terephthalate, and polyester resins, thermosetting resins, such as epoxy and silicone resins, and light transmissive materials such as glass. Furthermore, the light reflecting members, for example, are light reflecting materials such as resins in which a light reflecting filler is dispersed. Examples of base material of resins for forming a light reflecting member include silicone resins, phenol resins, epoxy resins, BT resins, polyphthalamide (PPA) and the like. For the light reflecting fillers, particles of a metal, or particles of an inorganic or organic material having a higher refractive index than that of the base material can be used.

Fifth Embodiment

In a fifth embodiment, an example of a liquid crystal display device using the planar light source 300 as the backlight light source will be explained. In the fifth embodiment, the explanation might be omitted for the same constituent elements as those in the embodiments already described.

Figure 47:
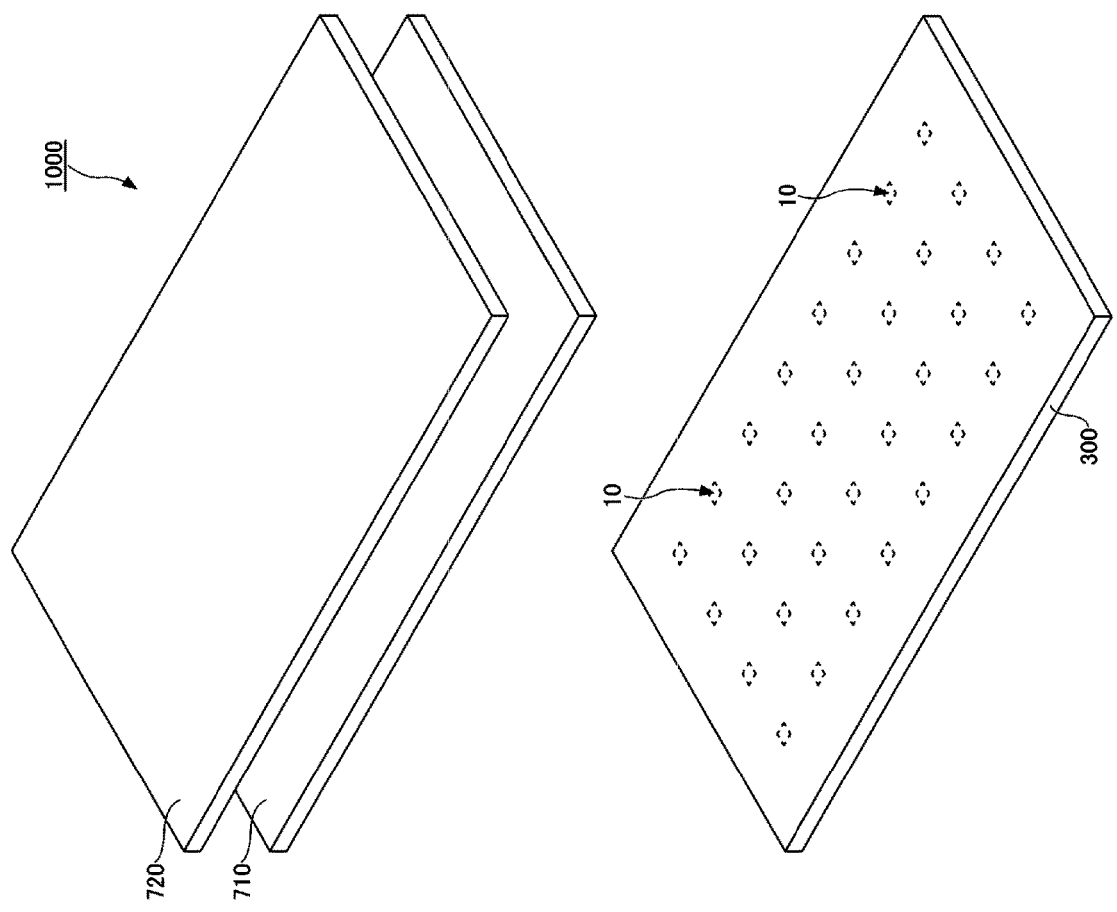
FIG. 47 is schematic diagram illustrating a liquid crystal display device related to a fifth embodiment.

FIG. 47 is a diagram illustrating a liquid crystal display device related to the fifth embodiment. As shown in FIG. 47, the liquid crystal display device 1000 includes, from the top, a liquid crystal panel 720, an optical sheet 710, and a planar light source 300. The planar light source 300 may include as an optical member 330, a DBEF (reflection-type polarizing sheet), BEF (brightness enhancement film), color filter, or the like.

The liquid crystal display device 1000 is a so-called direct-lit liquid crystal display device in which a planar light source 300 is placed under a liquid crystal panel 720. The liquid crystal display device 1000 irradiates the light from the planar light source 300 against the liquid crystal panel 720.

In general, in a direct-lit liquid crystal display device, because of the small distance between the liquid crystal panel and the planar light source, the color or luminance nonuniformity of the planar light source tends to cause the color or luminance nonuniformity of the liquid crystal display device. Accordingly, there is a need for a planar light source having reduced color and luminance nonuniformity for use as a planar light source of a direct-lit liquid crystal display device. Employing a planar light source 300 in a liquid crystal display device 1000 can reduce the luminance nonuniformity and the color nonuniformity of the display device by suppressing the peripheral portion of the panel from becoming less luminous while reducing the thickness of the planar light source 300 to 5 mm at most, 3 mm at most, 1 mm at most, or the like.

As described above, a planar light source 300 is suitable for use as the backlight for a liquid crystal display device 1000. In place of the planar light source 300, a planar light source 400, a planar light source 500, a light emitting module 600, or a planar light source that includes multiple light emitting modules 600 may be employed as the backlight for the liquid crystal display device 1000.

A planar light source 300 or the like is also suitable for use as the backlight for a television, tablet, smartphone, smartwatch, head-up display, digital signage, billboard, or the like. Furthermore, a planar light source 300 or the like can be utilized as an illumination source, such as in emergency lights, line lights, various types of illumination systems, automotive lights, and the like.

Certain embodiments of the present invention have been explained in detail above. The present invention, however, is not limited to the embodiments and specific examples described above, and various modifications and substitutions can be made to those described above without deviating from the scope of the claims.

What is claimed is:

1. A light emitting device comprising:
   a base;
   a phosphor frame positioned inward of edges of a lower face of the base;
   a light emitting element disposed in an area surrounded by the phosphor frame, wherein the light emitting element has an emission face, and an electrode forming face located opposite to the emission face, and the light emitting element comprises a pair of electrodes on the electrode forming face;
   a light transmissive member contacting at least a portion of the edges of the lower face of the base and at least a portion of outer lateral faces of the phosphor frame; and
   a light reflecting member that contacts the electrode forming face except for areas where the pair of electrodes are formed, and contacts the light transmissive member located around the electrode forming face; wherein:
   a lower face of the phosphor frame that faces the light reflecting member is spaced apart from an upper face of the light reflecting member; and
   the light transmissive member is disposed between the lower face of the phosphor frame and the upper face of the light reflecting member.

2. The light emitting device according to claim 1, wherein:
   the base contains a phosphor, and is monolithic with the phosphor frame.

3. The light emitting device according to claim 1, wherein:
   the base is a phosphor layer, a light transmitting layer, or a light reflecting layer, and
   the phosphor frame is adhered to the lower face of the base.

4. The light emitting device according to claim 1, further comprising:
   a light reflecting member disposed on an upper face of the base.

5. The light emitting device according to claim 1, further comprising:
   a protruded part that is located at at least one of the outer lateral faces of the phosphor frame and is monolithic with the phosphor frame and the base.

6. A planar light source comprising:
   a plurality of the light emitting devices according to claim 1 arranged in a one-dimensional or two-dimensional array.

7. A liquid crystal display device comprising:
   a backlight comprising the planar light source according to claim 6.

* * * * *